United States Patent [19]

Whitney et al.

[11] Patent Number: 4,814,546

[45] Date of Patent: Mar. 21, 1989

[54] ELECTROMAGNETIC RADIATION SUPPRESSION COVER

[75] Inventors: Leland R. Whitney, St. Paul; Charles D. Hoyle, Stillwater; Ronald W. Seemann, St. Paul, all of Minn.

[73] Assignee: Minnesota Mining and Manufacturing Company, Saint Paul, Minn.

[21] Appl. No.: 125,597

[22] Filed: Nov. 25, 1987

[51] Int. Cl.$^4$ .................. H01B 7/34; H01B 13/14; H05K 9/00
[52] U.S. Cl. .......................... 174/36; 156/51; 174/35 MS; 264/173; 342/1
[58] Field of Search ..................... 174/36, 35 MS; 252/62.54, 62.56, 519; 219/10.55 D; 342/1

[56] References Cited

U.S. PATENT DOCUMENTS

| | | | |
|---|---|---|---|
| 2,027,962 | 1/1936 | Currie | 174/DIG. 8 X |
| 2,249,091 | 7/1941 | Robinson et al. | 174/DIG. 8 X |
| 2,863,132 | 2/1958 | Sowa | 174/DIG. 8 X |
| 3,191,132 | 6/1965 | Mayer | 252/62.54 |
| 3,240,621 | 3/1966 | Flower, Jr. et al. | 252/62.54 |
| 3,526,896 | 9/1970 | Wesch | 342/1 |
| 3,843,593 | 10/1974 | Shell et al. | 260/40 |
| 3,908,267 | 9/1975 | Loyd et al. | 29/631 |
| 3,938,152 | 2/1976 | Grimes et al. | 342/1 |
| 3,950,604 | 4/1976 | Penneck | 174/68 |
| 3,951,904 | 4/1976 | Tomonaga | 260/40 |
| 4,003,840 | 1/1977 | Ishino et al. | 252/62 |
| 4,016,356 | 4/1977 | McLoughlin | 174/35 |
| 4,101,699 | 7/1978 | Stine et al. | 264/173 |
| 4,116,906 | 9/1978 | Ishino et al. | 260/22 |
| 4,137,342 | 1/1979 | Kanten | 427/127 |
| 4,163,117 | 7/1979 | Campbell et al. | 174/74 |
| 4,226,909 | 10/1980 | Kanten | 428/329 |
| 4,251,304 | 2/1981 | Campbell et al. | 156/85 |
| 4,319,074 | 3/1982 | Yaste et al. | 174/116 |
| 4,363,842 | 12/1982 | Nelson | 428/36 |
| 4,414,339 | 11/1983 | Solc et al. | 523/137 |
| 4,421,582 | 12/1983 | Horsma et al. | 156/86 |
| 4,486,721 | 12/1984 | Cornelius et al. | 174/36 X |
| 4,493,912 | 1/1985 | Dudgeon et al. | 523/137 |
| 4,499,438 | 2/1985 | Cornelius et al. | 174/36 X |
| 4,512,833 | 4/1985 | Kridl et al. | 156/94 |
| 4,538,151 | 8/1985 | Hatakeyama et al. | 342/1 |
| 4,555,422 | 11/1985 | Nakamura et al. | 428/36 |
| 4,624,879 | 11/1986 | Van Dijck et al. | 174/DIG. 8 X |
| 4,690,778 | 9/1987 | Narumiya et al. | 174/35 MS X |
| 4,699,743 | 10/1987 | Nakamura et al. | 252/519 X |

FOREIGN PATENT DOCUMENTS 51-30262  3/1976  Japan .

Primary Examiner—Morris H. Nimmo
Attorney, Agent, or Firm—Kinney and Lange

[57] ABSTRACT

An electromagnetic radiation suppression covering conformable to a corresponding selected structure through reducing the extent of a surface dimension therein and containing one or more absorptive kinds of particles in a sheet of a corresponding thickness including such particles as iron oxides with adsorbed surface layers, such covering being formed through extruding a mixture of selected particles and binding material.

93 Claims, 10 Drawing Sheets

REAL ————
IMAGINARY ————

PARTICULATE A COMPOSITE

REAL ――――――
IMAGINARY ― ― ― ―

PARTICULATE B COMPOSITE

PARTICULATE B COMPOSITE

PARTICULATE C COMPOSITE

REAL ———
IMAGINARY — — —

PARTICULATES A AND B COMPOSITE

REAL ———
IMAGINARY ———

PARTICULATE C COMPOSITE

REAL ————————
IMAGINARY ————————

ILLUSTRATIVE COMPOSITE

REAL ———
IMAGINARY — — —

ILLUSTRATIVE COMPOSITE

ILLUSTRATIVE COMPOSITE

PARTICULATE A AND B COMPOSITE

ILLUSTRATIVE COMPOSITES

ELECTROMAGNETIC RADIATION SUPPRESSION COVER

BACKGROUND OF THE INVENTION

Field of the Invention

The present invention relates to coverings for selected structures which, in the path of electromagnetic radiation, would otherwise cause such electromagnetic radiation to be present significantly in regions where unwanted and, more particularly, to coverings for suppressing such electromagnetic radiation in these regions in selected portions of the electromagnetic spectrum to a selected degree.

There are many sources emanating electromagnetic radiation, some by design including transmitters for various communications purposes such as information broadcasts or distance ranging and orientation determinations, and some arising as unavoidable incidents to the operation of various kinds of electrical or electronic equipment. The electromagnetic radiation emanating from these sources is subject to encountering various objects and being reflected therefrom or transmitted therethrough to a greater or lesser degree depending on the material or geometrical characteristics of such objects. Such radiation is particularly well reflected by those objects which are good electrical conductors such as structures of one sort or another containing metals.

In many instances, this reflection or transmission of such electromagnetic radiation places that radiation in regions or locales where it is unwanted. For instance, electromagnetic radiation emanating from a transmitter arrangement in a distance ranging system which impinges on, and is reflected from, any conducting structures in the immediate vicinity thereof will lead to substantial portions of this radiation being reflected directly back to the receiving arrangement of the system with unwanted effects.

On the other hand, a lack of any reflective or absorptive materials about an electromagnetic radiation source can also be a problem if the radiation therefrom is to be confined so as not to interfere with other equipment. Thus, any digital system operating at high switching rates will be a source of electromagnetic radiation which may not be in any way significantly confined if housed in a non-conductive structure such as a plastic enclosure.

Therefore, there is often a need to suppress the occurrence of electromagnetic radiation in certain regions relative to objects such as structures which are in the path of incident electromagnetic radiation from a source of such radiation. Among the means used to accomplish this end has been the use of materials which absorb impinging electromagnetic radiation and convert such radiation to heat to be dissipated within the material to thereby reduce the intensity of the radiation leaving such material. A typical material arrangement for accomplishing this is a composite material having a dielectric host, or binding, material portion in which are dispersed particles, capable of responding to impinging radiation in selected frequency ranges, these together providing an absorbing composite material. Such materials can be provided in various forms including paints or other coatings, sheets to be fastened to an underlying substrate perhaps after being bent to more closely match the substrate shape, preformed material structures to be fastened to a more or less matching underlying substrate, etc.

Various kinds of host or binder dielectric materials have been used including certain polymers and ceramics, among others. Similarly, particles of various natures have been used including metals, magnetic metals, semiconductors, and ferrites.

Such composite materials, however, are difficult to apply or fasten to the underlying substrates. The proper thickness of he material and its mounting are often very important to provide the desired suppression of electromagnetic radiation. The desired characteristics of such coverings can be difficult to achieve uniformly on many kinds of structures with many of these forms of material. These difficulties can be compounded by there often being a need to minimize the number of joinings of such material so that rain or other contaminates cannot reach the underlying substrate, and to reduce installation cost. Further, the desire to have suppression at some frequencies of incident radiation, but not at others, and to a selected degree requires particulates well suited to those selected frequency ranges. Particles are often needed in such quantities to assure reaching the degree of suppression desired that the weight of the absorbing material arrangement becomes too heavy for the system in which it is used.

SUMMARY OF THE INVENTION

The present invention provides an electromagnetic radiation suppression covering to suppress reflections of incident radiation on structures covered thereby having at least a sheet portion thereof selectively configured. Such a sheet is formed of a selectively conformable, polymeric binding material having one or more particles distributed therein. This sheet is characterized by a permittivity and a permeability parameter at least one of which has a significant imaginary part with respect to its real part at selected frequencies. This sheet, after being conformed to a structure selected to be covered, is of a resulting thickness that is (i) substantially one-fortieth to one-fourth of a wavelength of any electromagnetic radiation propagating in the sheet portion due to that radiation having impinged on the sheet portion containing at least some of the selected frequencies, or (ii) sufficiently great to provide a selected degree of absorption at the selected frequencies in the situation where a sufficiently low degree of impingment surface reflection has been arranged.

Various kinds of polymeric binding material and various kinds of particles therein, including ones with properties depending on frequency, have been found suitable for providing such a sheet portion having the indicated permittivity or permeability and having such a capability to conform resulting in the desired sheet thickness. The covering can be any of several configurations, including having a cross section of a continuous loop to form a tubular configuration, and may be provided as a laminate with the lamina having a selected polymeric binding material in at least a sheet portion and selected particles distributed therein. The laminate nearest the structure to which the cover is formed may alternatively be an electrical conductor. Gradations in the particulate distribution can provide radiation suppression results like those obtained in a laminar structure. Conformability can be provided by using a shrinkable material, one which shrinks in the presence of sufficient heat or solvent depending on the polymeric binding material chosen. Alternatively, an elastomer which can be mechanically stretched and then released to conform can be chosen for the binding material.

DETAILED DESCRIPTION OF THE PREFERRED EMBODIMENTS

Electromagnetic radiation emanating from a source as traveling waves moves through a vacuum or through a material medium with a corresponding characteristic velocity and will be reflected at least in part at discontinuities between various media encountered along its path. Where the material medium changes from relatively non-conductive to being quite electrically conductive, the reflected portion will be a very great fraction of the incident electromagnetic radiation impinging on such a conductive medium. These large reflections lead to electromagnetic radiation being present, as indicated above, in (i) regions in which it would otherwise not appear because of the change in the direction of travel on reflection of such radiation, or in (ii) regions which it is anticipated to be reflected to but to reach there at a later time with respect to the time of transmission of such radiation if the reflecting conductive body is closer to the source than other conductive or reflective bodies from which such radiation reflection is desired.

Figure 1:
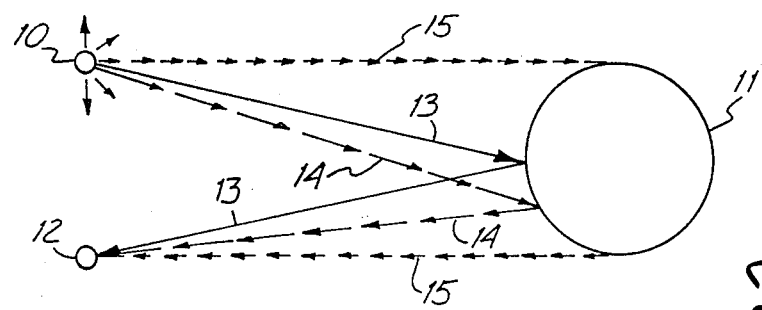
FIG. 1 is a schematic diagram showing transmission reflection effects.

Such electromagnetic radiation reflections can come about in many forms as is suggested in FIG. 1. There is shown in that schematic figure a representation of a source of electromagnetic radiation, 10, from which electromagnetic radiation is emanating as suggested by outward-pointing arrows. Some of that electromagnetic radiation impinges on a radiation reflector, 11, which in this figure can be considered a cross section view of an electrical conductor such as a metal cable, rod or wire. A portion of the radiation being reflected from conductor 11 reaches a region containing equipment, 12, in which such reflected radiation can lead to electronic signals that are unwanted because they are disruptive, or cause errors, mislead the operator, or lead to other undesirable effects.

If reflector 11 has a surface which appears to be an excellent reflector at the wavelength of the radiation being emanated, there will be specular reflection in which the angle of the instant radiation impinging on reflector 11 with respect to the local surface normal direction is matched by the angle of departure of the reflected radiation. This is suggested by long solid arrows, 13, showing this radiation path. Another possibility is non-specular reflection which can result from reflector 11 having a rough surface or a surface having particles embedded therein which are of a size that is on the order of the wavelength of the instant radiation. This reflection is shown by long dashed sequences of arrows, 14, which indicate that the angle of incidence of the impinging radiation may be considerably different than the angle of departure of the reflected radiation.

Other reflection types can also occur which are more subtle. As an example, the radiation path shown by the short series of arrows, 15, is the result of incident electromagnetic radiation impinging on conductor 11 at a very shallow angle on a surface thereof, which radiation then propagates along the surface of conductor 11 on that side opposite source 10 while continuously radiating in all directions. This includes radiating in such a direction as to lead to a return to equipment 12. Various other kinds of surface propagation phenomena are also known to occur.

If there is electronic equipment, such as receiving equipment, in some of those regions 12 in which reflected radiation is received though undesired, or received earlier than is desired, the result can be, as stated, the occurrence of unwanted effects in such equipment. In these circumstances, an arrangement to suppress such unwanted reflections of electromagnetic radiation is often considered for use with respect to the reflecting material medium which is the cause of the unwanted effects, this medium almost always being some electrically conductive structure. In some situations, a suppression of 30% of the impinging radiation on reflection is all that is needed, but in other instances much greater suppression is required.

Figure 2:
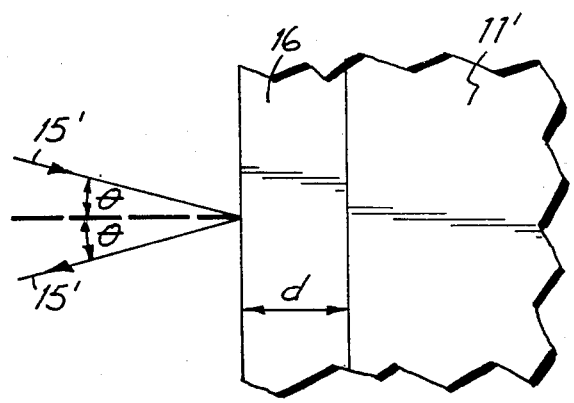
FIG. 2 is a cross section view of a portion of a structural arrangement having a reflector supporting an outer member involving the present invention.

An electromagnetic radiation suppression covering can be provided around reflector 11 as a screen to reduce the reflected electromagnetic radiation of selected frequencies which would otherwise occur at region 12 due to incident electromagnetic radiation containing such frequencies having impinged on and then been reflected from such a screened combination. FIG. 2 shows, for such an arrangement, a portion of a reflector, 11', (which is an electrical conductor) provided with a portion of such a suppression covering, 16, thereagainst. An arrow representing incident electromagnetic radiation, 15', is shown in FIG. 2 for the situation of specular reflection so that the angle, $\theta$, of incidence with respect to the local normal axis to the surface of covering 16 is equal to the angle of departure or reflection, from that surface with respect to this same axis.

The arrangement shown in FIG. 2 is an accurate representation for reflector or conductor 11' being such as to have a flat surface over which suppression covering 16 is provided with a uniform thickness. The representation in FIG. 2 is also accurate for curved surfaces for purposes of determining the effects of impinging electromagnetic radiation if the radius of curvature for the surface at any location under consideration for these purposes is sufficiently large with respect to the wavelength of the impinging radiation. If so, the impinging radiation behaves as though it were impinging on what is effectively a flat surface.

If the source of the electromagnetic radiation is sufficiently distant so that the radiation emanating from it can be taken as being represented by plane waves by the time it encounters the structure of FIG. 2, the condition which is placed on the surface curvature for it to appear effectively flat is that $\text{Im}(kr_{curv}) \gtrsim 1$ where $r_{curv}$ is the radius of curvature of the surface area under question and k is the wave number characterizing the plane wave incident electromagnetic radiation. The letters Im stand for the imaginary part of that which is enclosed in the parentheses following these letters, the wave number k typically being a complex number. Also, suppression covering 16 is assumed to be directly against conductor 11' so that conductor 11' serves as a ground plane (conductive reflector) without any intervening gap or other material being interposed therebetween which would lead to differing results than are obtained in the absence of such gaps or other materials.

There are two material media discontinuities shown in FIG. 2 for impinging radiation, the first being the change in material type going from the left side of layer 16 (which is assumed to be a vacuum or air having very little effect on the radiation) into layer 16. The second discontinuity in material is the change going from suppression covering 16 to electrical conductor 11'. Thus, there are possible reflections from two surfaces, the left-hand surface of suppression covering 16 and the left-hand surface of conductor 11'.

For impinging electromagnetic radiation to reach the left-hand surface of conductor 11', such radiation must impinge on and then travel within suppression covering 16, i.e. be transmitted through covering 16. The velocity of such electromagnetic radiation in suppression covering 16 will be affected by the relative permittivity of the material in suppression covering 16 taken as a whole, $\epsilon$, had the relative permeability of this same material, $\mu$. That is, the velocity of electromagnetic radiation in suppression covering 16 will be the velocity of this radiation in a vacuum divided by the index of refraction, n, for the material in layer 16, this index of refraction n depending on both and through $n = (\epsilon\mu)^{\frac{1}{2}}$. This change in velocity leads to there being a change in the wavelength, $\lambda$, of the radiation in the material of suppression covering 16 from the wavelength, $\lambda_o$ of the incident radiation traveling in a vacuum (or air) before impinging on covering 16, these wavelengths being related by $\lambda = \lambda_o(\mu\epsilon)^{-\frac{1}{2}}$. In addition, this material may have further effects on such radiation traveling therein through being absorptive to thereby lessen its intensity or energy.

As is well understood, an analysis of the electromagnetic radiation transmission and reflection situation of FIG. 2 can be made on the basis of the well known scattering parameters. A version of this analysis defines a propagator matrix at each interface between adjacent pairs of material media, and the matrix product of these matrices can be used to find a transmission coefficient and a reflection coefficient for this system. Since suppression of reflected radiation of some selected wavelength $\lambda_o$ is of primary interest, solutions subject to the condition that this reflection coefficient for the system be zero or thereabout are of primary interest here. The transmission coefficient at the surface of conductor 11' is zero because of its good electrical conductivity.

The polarization of the electromagnetic radiation traveling along path 15' of FIG. 2, i.e. the spatial orientation of the electric field associated therewith, needs to be taken into account in such an analysis. This spatial orientation is defined with respect to the plane of incidence which is that plane containing both the incident and reflected wave vectors, these wave vectors being normal to the planar wave fronts and pointing in the direction of energy flow. The radiation is defined to have a perpendicular polarization when the electric field is perpendicular to the plane of incidence, and to have a parallel polarization when the field is parallel to the plane of incidence. Radiation having other polarizations can also be represented as a combination of such perpendicular and parallel polarized waves.

The result of finding the reflection coefficient for the system of FIG. 2 for perpendicular polarization, and equating same to zero, is as follows:

$$1 = -i\left(\frac{\epsilon}{\mu}\right)^{\frac{1}{2}} \frac{\cos\theta}{\left(1 - \frac{\sin^2\theta}{\mu\epsilon}\right)^{\frac{1}{2}}} \tan\left[2\pi\frac{d}{\lambda_o}(\mu\epsilon)^{\frac{1}{2}}\left(1 - \frac{\sin^2\theta}{\mu\epsilon}\right)^{\frac{1}{2}}\right]$$

where i represents the imaginary unit or $i = (-1)^{\frac{1}{2}}$, $\lambda_o$ is the wavelength of the impinging radiation of interest and essentially that in a vacuum, as air has little electromagnetic effect. The thickness of suppression covering 16, d, is as indicated in FIG. 2. The corresponding result for radiation of parallel polarization is:

$$1 = -i\left(\frac{\mu}{\epsilon}\right)^{\frac{1}{2}} \frac{\left(1 - \frac{\sin^2\theta}{\mu\epsilon}\right)^{\frac{1}{2}}}{\cos\theta} \tan\left[2\pi\frac{d}{\lambda_o}(\mu\epsilon)^{\frac{1}{2}}\left(1 - \frac{\sin^2\theta}{\mu\epsilon}\right)^{\frac{1}{2}}\right]$$

Since impinging electromagnetic radiation arriving at an angle with respect to the surface introduces no new concepts, and since the case of normal incidence such that the angle $\theta = 0$ provides a substantial simplification, the foregoing two expressions, assuming such normal incidence, can each be written as follows:

$$1 = -i\left(\frac{\mu}{\epsilon}\right)^{\frac{1}{2}} \tan\left[2\pi\frac{d}{\lambda_o}(\mu\epsilon)^{\frac{1}{2}}\right].$$

This expression can be solved to obtain the proper thickness d for suppression covering 16 with the result $$d = \frac{\lambda_o}{2\pi(\mu\epsilon)^{\frac{1}{2}}} \tan^{-1}\left[\left(\frac{\epsilon}{\mu}\right)^{\frac{1}{2}}\right].$$

To have physical meaning, the thickness d of suppression covering 16 must be a real number. This last equation then implies that there are only certain values for the relative permittivity and for the relative permeability which give meaningful values for the thickness of suppression covering 16. Stated alternatively, merely varying the thickness will not result in a zero reflection coefficient, but rather the values of the relative permittivity and permeability must be properly chosen with a corresponding thickness if a zero reflection coefficient is to result.

Assuming that the relative permittivity and permeability are chosen in such a manner that the argument of the arc tangent in the last equation is real and of a substantial positive value, the arc tangent will approach its upper value of $\pi/2$. Substituting this value as the limit in the preceding equation, and using the relationship of the wavelength of the electromagnetic radiation in the material of suppression covering 16 to the wavelength of the impinging radiation indicated above, the thickness d for suppression covering 16 becomes $d=\lambda/4$. Thus, in these circumstances, the thickness of suppression covering 16 is to be a quarter of the wavelength $\lambda$ of that portion of the electromagnetic radiation propagating in that covering which has been transmitted from the incident radiation impinging on the left-hand surface of covering 16. This remaining portion of the incident electromagnetic radiation impinging on the left-hand surface of suppression covering 16 is reflected. That is, the incident electromagnetic radiation impinging on the left-hand surface of suppression covering 16 is partially reflected and partially transmitted.

The transmitted portion of the radiation reflects completely from the surface of the left-hand side of conductor 11' because of its substantial electrical conductivity. If the thickness for suppression covering 16 is $\lambda/4$, this radiation reflected from the left-hand surface of conductor 11' meets the reflected radiation from the left-hand surface of suppression covering 16 in the region to the left of this latter surface in the directly opposite phase so that destructive interference results. Thus, this solution for the thickness of suppression cover 16 is just that thickness needed for a single rightward or forward transversal of, followed by a corresponding single reverse or leftward transversal of, suppression cover 16 by the transmitted portion of the impinging electromagnetic radiation to result in destructive interference. This portion of the radiation which is first transmitted from the left-hand surface of suppression covering 16 in the structural arrangement of FIG. 2 and then reflected back through that surface interferes destructively with the portion which is reflected only from the left-hand surface of suppression covering 16.

Such destructive interference leads to the cancellation of each other by these portions of the electromagnetic radiation for that electromagnetic radiation impinging on the arrangement of FIG. 1 at the single wavelength $\lambda_o$. This cancellation results in the elimination of reflections of electromagnetic radiation having incident wavelength $\lambda_o$ from the structural arrangement of FIG. 2 in which conductor 11' is screened by suppression covering 16 with respect to such incident electromagnetic radiation, i.e. the reflections are suppressed. Note, as indicated above, that this solution is consistent with the transmitted radiation making a single transversal in and out of suppression covering 16. Without any additional reflections of the transmitted portion of the radiation at the material discontinuities to result in further transversals of the material in covering 16, minimum use is being made of this material per unit depth to absorb energy and maximum reliance is being placed on destructive interference to achieve the described suppression of overall radiation reflection in the system of FIG. 2.

Thus, this solution is likely to be the thickest value for suppression covering 16 which will be useful in suppressing radiation of incident wavelength $\lambda_o$ since it depends primarily on destructive interference because the reflected portion of the impinging radiation is essentially cancelled by a single transversal of the covering 16 material of the transmitted portion of the impinging radiation. Of course, there would be further solutions which are each a half wavelength multiple thicker than the solution just described that would also provide such destructive interference, but such suppression coverings are undesirable in that they add weight and cost, and are therefore unlikely to be used.

An alternate limiting case would then be use of a thin suppression covering having large absorption capabilities, perhaps as thin in some instances as one fortieth of the wavelength of radiation traveling in the covering. To give effect to this limit, the argument of the tangent factor, in the equation before the last solving for d, is replaced by its argument, a good approximation as the argument becomes small giving the result $$1 = -i\left(\frac{\mu}{\epsilon}\right)^{\frac{1}{2}}\left[2\pi\frac{d}{\lambda_o}(\mu\epsilon)^{\frac{1}{2}}\right].$$

This leads to a solution for d as follows:

$$d \simeq \frac{i\lambda_o}{2\pi\mu}$$

Since the thickness d must be a real number, this result means that the permeability must be purely imaginary, or at least in view of this being an approximation, must be quite large relative to its real part. As is well known in the electromagnetic theory of materials, the presence of an imaginary part in the permeability or the permittivity is the basis for absorption of electromagnetic radiation energy passing through such material. The absence of any reflected radiation at the selected wavelength or frequency from the system of FIG. 2 depends on significant material absorption but also can depend, due to the "impedance" of the materials involved, on destructive interference between (i) the portion of the incident radiation impinging on the left-hand surface of suppression covering 16 which is partially reflected, and (ii) the portion thereof which is transmitted which impinges on that same surface from the right because of multiple internal reflections in covering 16 of that partially transmitted portion.

The limiting case for suppression radiation reflections at a selected wavelength $\lambda_o$ just described using a thin suppression covering having large absorption capabilities, as represented by the last equation, is the solution resulting if the covering material "impedance" is much greater than one. The impedance is the square root of the ratio of $\mu$ to $\epsilon$, $Z=(\mu/\epsilon)^{\frac{1}{2}}$. Thus, for $\mu$ large with respect to $\epsilon$, the impedance will be large.

The partial reflection of incident radiation from the left-hand surface of suppression covering 16 is a function of the impedance because the reflection coefficient for this interference taken alone is related to the impedance by $$r = \frac{Z_s - Z_o}{Z_s + Z_o}.$$

The typical situation of air occuring to the left of cover 16, $Z_o \approx 1$. For suppression covering impedance much greater than one or much less than one, the amplitude of the electric field part of the partially reflected wave is comparable to the amplitude of the electric field part of the incident wave and there would be a large resulting reflection. Destructive interference is required to be provided in such a situation to achieve nearly zero total reflected power.

For impedance in the suppression being much greater than one or much less than one, the amplitude of the electric field part of the partially reflected wave is comparable to the amplitude of the electric field part of the incident wave. To achieve nearly zero total reflected power from the suppression covering against conductor 11', the vector sum of the fields in the waves moving to the left away from the left-hand surface of suppression covering 16 must be zero. The waves moving to the left away from the left-hand surface include the partially reflected incident wave and the series of waves arising from the partially transmitted incident wave. The partially transmitted wave gives rise to a series of waves moving to the left away from the left-hand surface due to multiple reflections at the surfaces of the covering and partial transmission at the left-hand surface of the covering. If the vector sum of the fields moving away from the surface is nearly zero so that the total reflected power is nearly zero, the covering has suppressed the reflection through destructive interference. If the impedance of the suppression covering is much greater than one or much less than one, destructive interference is required to achieve nearly zero total reflection.

Two alternative limiting cases for this suppression are also possible for a thin suppression covering having large absorption capabilities but having impedances much less than or roughly equal to one if $\epsilon$ is large with dielectric loss tangents $$\delta_\epsilon = \frac{IM_\epsilon}{Re_\epsilon}$$

either (i) less than, or (ii) greater than, about the tangent of 35°. Suppression coverings with large $\epsilon$ and dielectric loss tangents less than about the tangent of 35° require $\epsilon$ to be small relative to $\epsilon$ to achieve zero total reflection. This can be seen from the definition of Z above to be a small impedance solution. Suppression coverings with large $\epsilon$ and dielectric loss tangents greater than about the tangent of 35° require $\mu$ to be roughly equal to $\epsilon$ again achieve zero total reflection. This is a solution with impedance roughly equal to one as can be seen by again considering the definition of the impedance. In this instance, the amplitudes of the electric and magnetic field parts of the partially reflected wave is nearly zero; hence, destructive interference is not required to achieve nearly zero total reflected power. However, the absorption in suppression covering 16 must be sufficient to eliminate any reflections from conductor 11'.

In typical arrangements of suppression covering 16 which rely on both destructive interference and absorption to eliminate, or nearly eliminate, reflections of electromagnetic radiation impinging on the structural arrangement of FIG. 2 in at least selected regions with respect thereto, the foregoing suggests that there must be a careful selection of the material and configuration for suppression covering 16. That is, the constituent materials for suppression covering 16 must be chosen to yield the necessary permittivity and permeability parameters of the material taken as a whole to thereby give the desired reflection result in conjunction with the choice of thickness for that material. However, several other criteria must be met by suppression covering 16 to be suitable in the several situations that can occur for it to serve successfully as a means for screening selected structures which would otherwise cause unwanted reflections of impinging electromagnetic radiation.

Some of these have already been alluded to above. First, although there are a number of situations in which a narrowband suppressor is desired for suppressing reflections of impinging electromagnetic radiation in a single or relatively narrow range of frequencies, there is often a desire to have a wideband suppression covering to thereby suppress reflections of impinging electromagnetic radiation over a substantial range of frequencies. Further, suppression covering 16 should be assured of having intimate contact with a conductive material against the side thereof which is facing the structure to be screened even though such structure may have an irregular surface. As indicated, gaps or other materials interposed between suppression covering 16 and such an electrically conductive surface serving as a ground plane (conductive reflector) may lead to unexpected results in shifting the range of frequencies of impinging electromagnetic radiation which is suppressed or negating such suppression to a significant degree if not altogether.

In addition, many structures are already completed, in-plane structures with conductive members therein causing reflections which were not expected to be undesirable, or were not expected to occur, or which occur after later installed transmitter or receiver equipment, or both, are introduced nearby, or some other problem not found until after the structure is completed. Thus, suppression covering 16 should be configured in such a manner that it can be retroactively applied around such selected structures to screen them so as to suppress reflecting of electromagnetic radiation impinging thereon. Alternatively, in fabricating new structures, suppression covering 16 should be applicable about such structures in an effective and economical manner in a way which permits later installation effectively. Further, suppression covering 16 in providing such reflection suppression screening about selected structures may have to do so in adverse environments such as weather, a variety of chemical atmospheres, etc. In doing so, suppression covering 16 may be required to maintain a watertight seal, withstand temperature extremes, withstand corrosion, and the like.

These various criteria can usually be met by choosing a composite material for suppression covering 16. Such a composite material will have a host material, or binding material, in which is distributed one or more selected kinds of particles such that such materials in combination together provide the desired material characteristics for suppression covering 16.

A binding material, or host material, for such a composite material which can be selectively conformed to a corresponding selected structure can, in many instances, assure that suppression covering 16 will thereby fit tightly against that selected structure if that structure is not too involuted. This will assure that the selected structure, as an electrical conductor, will provide a good ground plane to assure the system in the manner of FIG. 2 operates as designed. If the structure is so involuted as to make conforming to it prohibitively difficult, a metal layer can be positioned between the solid structure and suppression covering 16, as shown in FIG. 3, to assure that suppression covering 16 is against a good electrical conductor to provide a sufficient ground plane.

Figure 3:
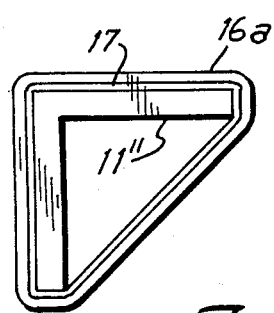
FIG. 3 is a cross section view of another structural arrangement having a reflector supporting an outer member involving the present invention.

FIG. 3 shows a selected structure, 11", in the form of an "angle iron" or pair of steel strips affixed at right angles to one another along the length thereof. However, this is merely exemplary and could just as well be represented by other structural metal shapes including such common ones as I-beams, channel beams, braided cables, etc., having surfaces which are difficult to get a screening covering to conform to. Surrounding angle iron 11" is a braided metal mesh covering, 17, which is pressed against the surface of angle iron 11" by suppression covering, 16a, shown at its end, except those surfaces thereof which form and are immediately adjacent to the included right angle. Thus, in this arrangement, there is in effect a laminar suppression arrangement about angle iron 11" formed by braided metal mesh 17 as an interior lamina, serving as a ground plane, which is pressed against angle iron 11" except within the right angle area by suppression covering 16a serving as an outer lamina.

Metal mesh 17 can be formed, for instance, by a tinned copper braid such as Scotch Brand 24 Electro Shield Tape supplied by Minnesota Mining and Manufacturing Company (3M). Alternatives to use of a mesh braid to provide a ground plane would be to metallize the surface of the interior of suppression covering 16a or to fill spaces between the covering and the structure with an electrically conductive sealer.

The pressing by suppression covering 16 of mesh 17 against angle iron 11" in FIG. 3 is accomplished very well by choosing the binding material, or host material, of suppression covering 16a to be capable of being placed over mesh 17 and angle iron 11" and shrunken thereagainst in a suitable manner. The result is that suppression covering 16a is selectively conformed through forces internal thereto to angle iron 11" about mesh 17 to provide a close fit.

Figure 4:
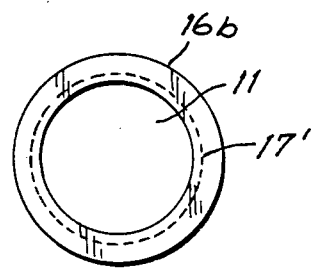
FIG. 4 is a cross section view of another structural arrangement having a reflector supporting an outer member involving the present invention.

In another embodiment, this kind of arrangement can be used for conforming suppression covering 16 of FIG. 2 to a less involuted structure, like that of rod or cable 11 in FIG. 1, with the result shown in the cross section view of FIG. 4. This structure of smoother surface contour allows the elimination of mesh 17 as this suppression covering, 16b, shown at its end, conforms by shrinking due to forces internal thereto directly against the entire surface of conductive rod or cable 11. The result in FIG. 4 is that suppression covering 16b is conformed about conductive cable 11 in a tight fit thereagainst so that conductor 11, as screened by covering 16b, serves as a ground plane for the structural system of FIG. 4. If conductor 11 is a large braided cable having a number of spiral grooves of some depth at its surface, a mesh, 17', could be used in the systems of FIG. 4 as is indicated by the dashed lines therein. Mesh 17' would not be needed, however, if suppression covering 16 forms itself as a result of shrinking with a sufficiently close fit to conductor cable 11.

The situation described for the structural systems of FIGS. 3 and 4, having suppression covering shrunken against a conductive base is especially effective for those situations where the structure being screened by the covering has already been formed and is to be installed. In these situations, the suppression covering may be formed as a tube, usually by extrusion, and positioned over and around such a structure selected to be screened thereby, perhaps angle iron 11" shown in FIG. 3 or conductive rod or cable 11 shown in FIG. 4, or some other selected structure. This covering is then shrunken against the selected structure by suitable means. An end portion of such a tube, again designated 16b, suitable for these purposes is shown in FIG. 5A, with the end of the tube shown having a cross section which follows a seamless closed curve.

Figure 5A:
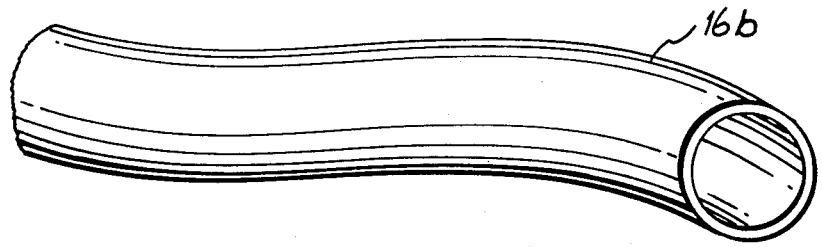
FIGS. 5A, 5B, 5C and 5D show alternative embodiments of the present invention.

In an alternative situation, the structure selected to be screened may be already installed between supports making it difficult or impossible to position a tube with a closed circumference, such as that shown in FIG. 5A, thereover, at least without extensive disassembly of the installed structure. In these instances, suppression covering 16b of FIG. 5A can be divided or slit parallel to its lengthwise axis such that the structure that was a tube can now have the wall thereof spread apart from the slit at which it has been divided as in the end portion version, 16c, shown in FIG. 5B. This arrangement can then be positioned about and wrapped around the installed structure selected for screening.

Figure 5C:
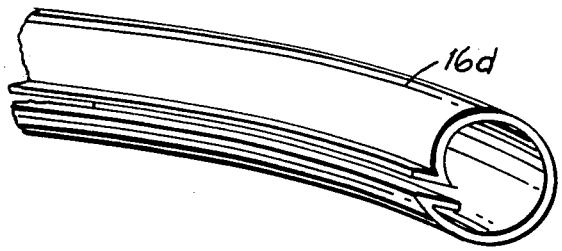
Figure 5B:
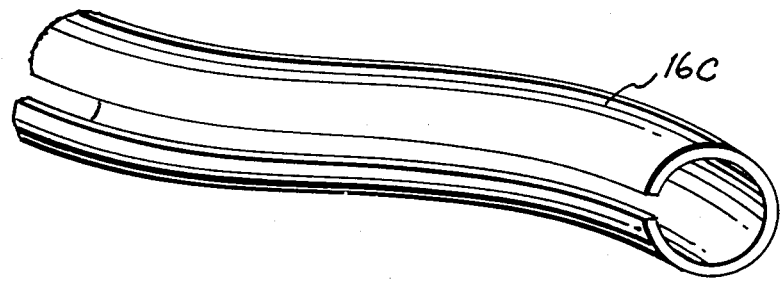

Alternatively, a shape like that of tube-like covering 16c in FIG. 5B could be also extruded but with a lengthwise opening along a side thereof. Again, this suppression covering arrangement could be spread apart and then positioned about and wrapped around the installed structure selected for screening.

In an additional alternative, a locking means could be extruded along the lengthwise opening in this arrangement so that the positioning of the tube around the structure selected for screening is maintained after being wrapped thereabout. To do so, one edge of the lengthwise opening in this arrangement is, through the locking means, locked to the other to hold the tube-like arrangement in position for further joining steps. In FIG. 5C, an end portion of a suppression covering 16d, is shown with two differently directed, one in and one out, angled wall extensions along an edge of the lengthwise opening. These angled wall extensions can be placed with one inside the other after being wrapped about a selected structure to lock covering 16d in that position.

Either of the configurations shown in FIG. 5B and 5C, or other similar split tube configurations, can be finished as a complete tube through joining the edge regions on opposite sides of the lengthwise opening together permanently through bonding. Such bonding can be accomplished, for instance, with an adhesive, or with a pressure sensitive tape, or with other means strong enough to hold the edge regions together on opposite sides of the lengthwise opening in a fixed relative position during the subsequent shrinking step used to provide conformance of the suppression covering to the structure selected to be screened. After such edge joining, the suppression covering would have a cross section which would again follow a closed curve but with a seam.

A suitable adhesive or pressure sensitive tape to be used with the elevated temperature encountered in heat shrinking may depend on the particular material chosen for binding or host material in the composite material used for the suppression covering. However, a generally satisfactory adhesive and composite material treatment begins with treating the surface of the suppression covering to enable a polar liquid to wet its surface, then coating the surface so treated with a monomer selected from acrylic acid, methacrylic acid and others thereof, acrylamide, methacrylamide, sterically non-hindered tertiary alkyl acrylamides and methacrylamides, secondary alkyl acrylamides and methacrylamides having three or less carbon atoms in the alkyl group, and N-vinyl pyrrolidone. This is followed by irradiating the coated surface to graft-polymerize the monomer to the suppression covering. Finally, there is applied a layer of acrylic-type pressure sensitive adhesive over the graft-polymerized surface. A generally satisfactory pressure sensitive tape is 3M Brand tape No. 69.

Figure 5D:
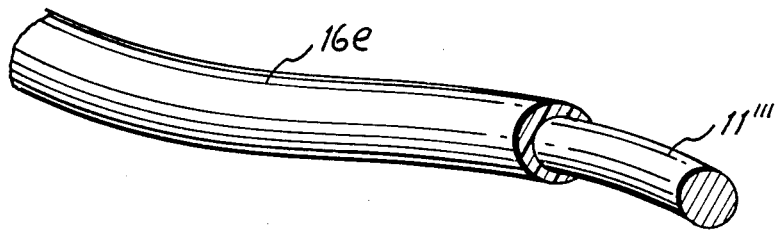

In other situations where structures selected for screening are first being fabricated, a suppression covering can be formed directly about and against the conductor structure which has been selected for screening. Thus, a conductive wire or cable or rod can have a suppression covering extruded thereabout at the time of fabrication of the screened structure. Such an arrangement is shown in FIG. 5D where an end portion of a suppression covering, 16e, is shown extruded about an end portion of a conductor, 11'''. Again, a cross section of suppression covering 16e follows a seamless closed curve. Clearly, suppression covering 16e could be a shrinkable covering like coverings 16b, 16c or 16d, and then be used in a suitable positioning and shrinking process at the time of fabricating a screened conductor such as shown in FIG. 5D rather than being extruded therewith.

To be shrinkable, the binding or host material will be chosen as a polymeric material which can be selectively caused to shrink after being positioned about a structure selected to be screened so as to be able to conform thereto upon shrinkage due to some shrinkage initiating event. Some typical polymeric materials would be those which can be shrunk as a result of a significant application of heat thereto with the initiating event being such an application of heat. The heat will usually be applied by convective or conductive means rather than by radiative means as the electromagnetic radiation absorption characteristics of the composite material will usually be determined by the need to suppress radiation reflections at frequencies lower than infrared which will usually not accommodate also choosing the characteristic of sufficient infrared absorption for heating purposes. Another polymeric material would be one which can be shrunk as a result of a solvent being evaporated therefrom with the initiating event being this evaporation of a solvent therefrom. A further possibility is to have the polymeric material be an elastomer which is mechanically stretched over and around the structure selected to be screened and then released to thereby conform to such structures.

In each of these forms of suppression covering conformance, the extent of a surface in at least one direction is reduced, i.e. shrunk, to result in a selective conformance of the suppression covering about the corresponding structure selected to be screened. During such shrinking, the only forces acting to reduce this surface extent are forces internal to the polymeric material, that is, molecular forces, which are given effect through the corresponding initiating event.

However, considerable care must be used in selecting the kind of polymeric material forming suppression coverings 16, 16a, 16b, 16c or 16d both as to its shrinkage properties and as to its electrical and magnetic properties (only these latter properties need be considered for the material of covering 16e) in conjunction with the electromagnetic properties of the particles distributed therein. As indicated above, the suppression of reflection of electromagnetic radiation of selected frequencies that has impinged upon a structure, in at least some regions with respect thereto, which has been screened by such a composite material will be negligible for only certain selected combinations of the permittivity or permeability, or both, of this composite material and its final thickness after being conformed to the selected structure. Thus, for one of these suppression coverings fabricated with the selected polymeric material having selected particulates distributed therein, there is a selected thickness for the resulting composite material which must be met after such a covering has been conformed to a selected structure if the desired result for radiation suppression is to be obtained.

The final thickness of a suppression covering resulting after conformance, or shrinking, can be predicted on the basis that the volume of the shrinkable polymeric binding or host material, with the selected particulate or particulates distributed therein, will remain essentially constant from the initial state the covering was in before shrinking to the final shrunken state (although that volume may change during the actual shrinking). Thus, knowing the initial volume of the suppression covering before shrinking and knowing the dimensions of the corresponding structure selected to be screened or the final dimension of the interior periphery of the suppression covering after shrinking, the final thickness of this covering can be successfully predicted. The small size of the polymeric material molecules relative to the particulates distributed in that material, which together form the composite material results in the properties of the composite being independent of the particulates in its final crystalline state. Though the rate of crystallization may be affected by the particulate types distributed in the polymeric material because of different heat capacities for different kinds of particles, and the like, the final crystallization state of the polymeric material will essentially be the same whatever the particulate type used.

For a suppression covering 16e of the extruded type shown in FIG. 5D where conformance about the structure selected to be screened is provided at the time of fabrication, the situation is significantly eased with respect to final thickness. The final thickness will be just that which results from the extrusion process itself and which is relatively easily controlled.

In both these instances, however, the choice of the electrical and magnetic properties of the polymeric material and the particulates to be distributed therein must be carefully made if the composite material is to have the desired permittivity and permeability planned for a given covering thickness to yield the desired negligible reflection of that electromagnetic radiation of selected frequencies having impinged on a structure screened with such composite material. The polymeric binding material, or host material, will usually not itself have any significant magnetic properties and so will not respond to magnetic fields. As a result, the permeability of this material will usually equal one. On the other hand, the permittivity of the polymeric binding material will be significant, and will vary with the choice of material type and with direction therein.

A polymeric binding or host material which is to be heat shrinkable will be a thermoplastic material which is capable of having a selected stress locked into it. Both crystallizable and amorphous polymers or copolymers which can be cross-linked or oriented may be used to lock in stresses. Further, they should be conveniently useable at temperatures below the melt temperature thereof. Thus, melt temperatures should be above ordinary room temperature, typically 95° C. to 225° C. The crystallizable materials can be selected from the polyolefin polymers and copolymers thereof, these polymers including polyethylene, and polypropolyene, and polyvinyl chloride. The amorphous materials can be selected from the silicone, polyacrylate and polystyrene polymers and copolymers. A copolymer introduced to provide cross-linking prevents melting of the thermoplastic during heat shrinking.

If the polymeric binding or host material is to be solvent shrunk or mechanically stretched and then released over the structure selected to be screened, such a material can be an elastomer selected from (i) the synthetic elastomers such as the reactive diene polymers including polychloroprenes, EPDM, and the like, and (ii) the natural rubbers. Suitable solvents for solvent shrinking can be selected from the aromatic hydrocarbons and the aliphatic hydrocarbons. In those situations where the suppression covering is to be extruded on a wire or cable at the time of fabrication, the extruded material can be chosen from among polyvinyl chloride, polyethylene, polyamide or polyurethane.

A particular polymeric binding, or host, material which has been successfully used for a heat shrinkable suppression covering is formulated as follows:

TABLE I

| Co. | Product Designation | Chemical Composition | Weight Fraction (%) |
|---|---|---|---|
| U | DPDA 6181 | Ethylene-ethyl acrylate copolymer | 26.82 |
| U | DPD 6189 | Ethylene-ethyl acrylate copolymer | 26.82 |
| D | FR-300 BA | Decabromo diphenyloxide | 24.49 |
| — | — | antimony oxide | 8.16 |
| | Maglite D | Magnesium oxide | 4.37 |
| | — | Zinc Oxide | 3.21 |
| S | SR 350 | Trimethylol propane trimethacrylate | 3.21 |
| C | Irganox 1010 | Hindered phenol antitoxidant | 1.17 |
| C | Irganox 1024 | Hindered phenol antioxidant 1010 plus metal deactivator | 1.17 |
| | — | Stearic acid | 0.58 |
| | | | 100.00 |

C = Ciba-Geigy Corporation
D = Dow Corning Corporation
S = Sartomer Company
U = Union Carbide Corporation The antimony oxide together with the decabromo diphenyloxide add flame retardancy to the binding material. The zinc oxide and the magnesium oxide are heat stabilizers for the resin to said in maintaining its polymeric form, particularly during compounding and fabricating. The trimethylol propane triacrylate promotes cross-linking. The hindered phenols are for oxidative stability during subsequent use of the suppression covering typically in air, and the metal deactivator is to inhibit corrosion of metal particulates distributed in the binding material. The stearic acid is a processing said serving as an internal lubricant. The blend of two similar resins is to provide a better balance of physical properties and processing properties such as tensile strength and flexibility and viscosity.

The electrical and magnetic properties of the foregoing, and other binding or host materials combine in complicated ways with the electrical and magnetic properties of the particulates distributed therein to provide the electrical and magnetic properties of the composite material. The permittivity of the composite material is not a linear combination of the permittivity of the binding or host material weighted by its volume fraction and the permittivity of the particulates weighted by one or more corresponding volume fractions. Similarly, the permeability of the composite material is not a linear combination of a volume fraction weighted binding material permeability (likely to be one) and volume fraction weighted particulate permeability. Such combining on a volume basis provides no recognition of the strong effects provided by differing shaped particles.

As an example, a conductive particle which is small with respect to the wavelength of an electromagnetic plane wave impinging thereon experiences a high frequency alternating electrical field which is essentially uniform across the particle. Such a field tends to move electrical charges in the particle back and forth toward the opposite ends thereof in an oscillatory manner as the charge attempts to follow the continually reversing electric field. Movement of electrical charge in time is an electric current which flows back and forth in the particle leading to energy losses therein due to the electrical resistance of the particle with particle heating the result. These energy losses are reflected by the occurrence of an imaginary part in the conductivity or the permittivity which part depends on the frequency of the impinging field, as faster reversals increase the charge flow energy loss, and on the static conductivity (increases in the static conductivity in effect shift frequency effects to a higher frequency).

This same oscillation of charges back and forth in tee particle gives the particle an alternating polarization and so an additional energy loss by giving rise to a radiating dipole field, in effect scattering the impinging radiation.

If the particles are far from a symmetrical shape along some axes, that is, far from being spherical, the loss of energy from the impinging electromagnetic wave may be significantly different than what it would be for a spherical particle. The charge accumulating at an extremity during a flow in one direction in the particle before that flow direction reverses, gives rise to a charge accumulation at the extremity of the particle leading to an induced electrical field intending to oppose the applied field. This induced field, the depolarizing field, has a strength at a point in the particle which depends on the particle shape since this strength is related to the square of the distance from that point to the locations of the charges. If that depolarizing field strength becomes comparable to the strength of the applied field, the current flow would be reduced and, as a result, so would energy losses due to the resistive heating. However, in a particle which is long with respect to the current flow paths, there will be a relatively low depolarizing field with the charge accumulating at relatively distant extremities and hence significant current flow will continue with the accompanying heating losses.

Thus, a particle which is in the form of a conductive whisker, i.e. a long, thin sliver, will be an effective particle for causing substantial resistive heating losses in energy of impinging radiation. An insulating particle with a conductive coating thereabout will also lead to weak depolarizing fields because much of the charge will oscillate back and forth within the coating at the extreme ends with respect to the field direction, but these closely spaced charge distributions at the extreme ends will lead to small resultant fields which will tend to cancel out in intermediate positions in the particle leading to weak depolarizing fields there.

If the particles are sufficiently large to be comparable to or greater in size than the wavelength of plane wave radiation traveling in the suppression covering, the electric field part of the radiation at any one time will change across the extent of the particle during an oscillation so that currents are always flowing in the particle and in varying paths. These are, in effect, eddy currents giving energy losses due to resistive heating. Again, particle size and shape, and the frequency content of the impinging radiation, all have an effect on the amount of energy lost by the radiation traveling through a suppression covering having these particles.

The concentration of particles in the binding or host material also makes a significant difference. For a volume fraction that is below the "percolation threshold" of the particle concentration value above which particle concentration is such that an electrically conductive composite results, particle clusters in a yet non-conductive material will occur, with some of the clusters forming local continuous conductive paths or loops. The magnetic field part of the impinging radiation traveling in the suppression covering which results in magnetic flux passing through such loops will thereby induce a current in the loops. These currents again lead to an energy loss due to resistive heating, and to scattering because of the radiation arising from the current flow in the loops. The percolation threshold is dependent on the shape of the particle, the particle orientation, and the particle dispersion. The number of loops present increases rapidly as the percolation threshold is approached. The diamagnetic response depends on frequency because more frequent flux reversals through the loops lead to greater radiation energy losses. Thus, the losses are frequency dependent and further depend on the particle shape and orientation in setting the percolation threshold and so the number of such loops present.

The magnetic field part of the impinging radiation traveling in the suppression covering also affects any magnetic particles included therein. These particles usually have a magnetization which tends to persist in a preferred direction in the particle. The magnetic field in the radiation will tend to rotate this magnetization to align with the field direction, and so an alternating magnetic field such as occurs with radiation will tend to cause the magnetization to precess about the preferred magnetization direction. This precession will lead to an energy loss because of the interaction of the magnetization with other domains nearby. Such a particle system will have a resonant frequency at which the precessing magnetization is best able to follow the frequency of the alternating magnetic field. The greater the eccentricity of the shape of the particles, the higher this resonant frequency will be, thereby leading to greater losses.

Conductive magnetic particles are also subject to eddy currents if the wavelength of the electromagnetic radiation is comparable or greater in size than is the particle as indicated above. Such flowing eddy currents will give rise to energy losses as indicated before due to electrical considerations, but these flowing currents will also lead to additional magnetic fields which can affect the loss of energy in impinging radiation traveling in the composite material.

This large number of possibilities for varying kinds of interaction between various kinds of particulates dispersed in the composite material and any impinging radiation traveling therein leads to a large number of possibilities for the resulting permittivity and permeability of the composite material, but, clearly, the resulting permittivity or permeability will vary with the frequency of the impinging electromagnetic radiation. The selection of particles of various sizes, static conductivities, permeabilities, permittivities, shapes, and orientations in various combinations means a very wide variety of composite materials using a conformable host or binding material can be found which, with properly chosen thickness therefor, can suppress reflections at selected frequencies of electromagnetic radiation impinging on systems with structures screened by such materials. However, the choice of a binding or host material and the particles to be distributed therein must be carefully made, not only because of the need to match the composite material properties with its thickness to reduce reflections from a system screened by that material as indicated above, but also because of the complex manner in which the electromagnetic properties of the particles and the binding material combine to form the properties of the composite material.

That is, the prediction of the electrical and magnetic properties of the composite material from the electrical and magnetic properties of both the binding or host material and the particulate type or types to be distributed therein must take into account all of the various factors if the resulting composite material is to have the predicted permittivity and permeability. These predictions can be successfully done by combining the electric and magnetic fields in the composite material due to the host material and the particulates distributed therein and by combining the polarizations and magnetizations due to each. The composite material permittivity and permeability can then be obtained in terms of the host material and the particulate permittivities and permeabilities on this basis rather than on the basis of merely a volume fraction weighting which ignores effects of particle shape. This combining of these fields as a basis for finding the composite material permittivity and permeability leads to consideration of particle shape, particle orientation, particle distribution, interactive frequency effects and the like.

To show the nature of one of the simpler situations encountered in finding a resultant composite material permittivity and permeability, an analytical form result is presented based on the permittivities and permeabilities of a single particulate, $\epsilon_p$ and $\mu_p$, and of the binding or host material, $\epsilon_m$ and $\mu_m$, on the basis of using the average total fields due to the field contributions of the particulates and the binding or host material in the composite material. This assumes that the particles will be small with respect to the wavelength of the impinging plane wave radiation of interest, that the particles used in the composite are present in a low volume fraction, and that the particles have a shape reasonably approximated by an ellipsoid. In these circumstances, the permittivity tensor for the composite material as a whole can be shown to be the following:

$$\epsilon = \frac{(1-f)\epsilon_m + f\Gamma_\epsilon \cdot \epsilon_p}{(1-f)\bar{1} - f\Gamma_\epsilon}$$

where f is the volume fraction taken by the distributed particulates in the composite material, $\epsilon_m$ and $\epsilon_p$ are second order tensors representing the permittivity of the host or binding material and the particulate, respectively, $\bar{1}$ represents a unit second order tensor, and $\Gamma_\epsilon$ represents a second order tensor having elements which depend on $\epsilon_m$, $\epsilon_p$ and parameters determined by the shapes of the particles in the particulate.

Under the same assumptions, and the additional assumptions that the particles are single domain ferromagnetic or ferrimagnetic particles which have their magnetizations aligned in a particular direction because of magnetic interaction, and that the binding or host material is non-magnetic so that $\mu_m=1$, the permeability of the composite material is a second order tensor given by the expression $$\mu = \frac{(1-f)\bar{1} + f\Gamma_\mu \cdot \mu_p}{(1-f)\bar{1} - f\Gamma_\mu}$$

where f again is the volume fraction taken by the particles in the composite material, $\bar{1}$ is a unit second order tensor, $\mu_p$ is a second order tensor representing the permeability of the particles in the particulate distributed in the composite, and $\Gamma_\mu$ is a second order tensor which depends upon $\mu_p$ and parameters determined by the shape of the particles. As the foregoing equations show, the determination of the permittivity and the permeability of the composite material, whether by analytical methods or numerical methods, leads to results which are considerably more complicated than the mere summing of the particle and host or binding material properties weighted by the volume fractions of each.

Continuing further with the binding material example above, two kinds of particulates were chosen by the prediction methods indicated in the last paragraph to be placed in a composite material, as indicated above, to provide suppression of reflection of electromagnetic radiation impinging on a selected structure screened by such a composite material at a frequency selected to be about 10.0 GHz. The first kind of particulate, A, has particles of ferrosoferric oxide ($\gamma FeO_xFe_2O_3$) having a thin layer of cobalt adsorbed on the surface thereof, shaped in an acicular form having its greatest dimension averaging approximately 0.4 $\mu m$. The value of x is between 1.0 and 1.5 with the cobalt in the surface layer providing one to ten percent of the particle weight. The second kind of particulate, B, has particles of ferric oxide ($\gamma Fe_2O_3$) having a thin layer of cobalt and doubly ionized iron atoms adsorbed on a surface thereof with a shape and dimension similar to those of the particles of the first particulate.

Figure 6A:
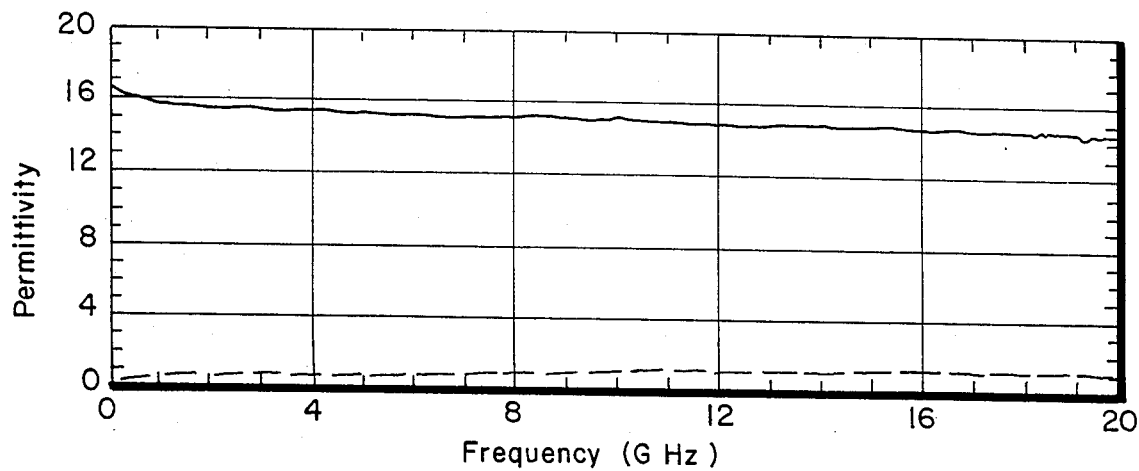
FIGS. 6A, 6B and 6C are graphs presenting properties of an embodiment and of constituents of an embodiment of the present invention.
Figure 6A:
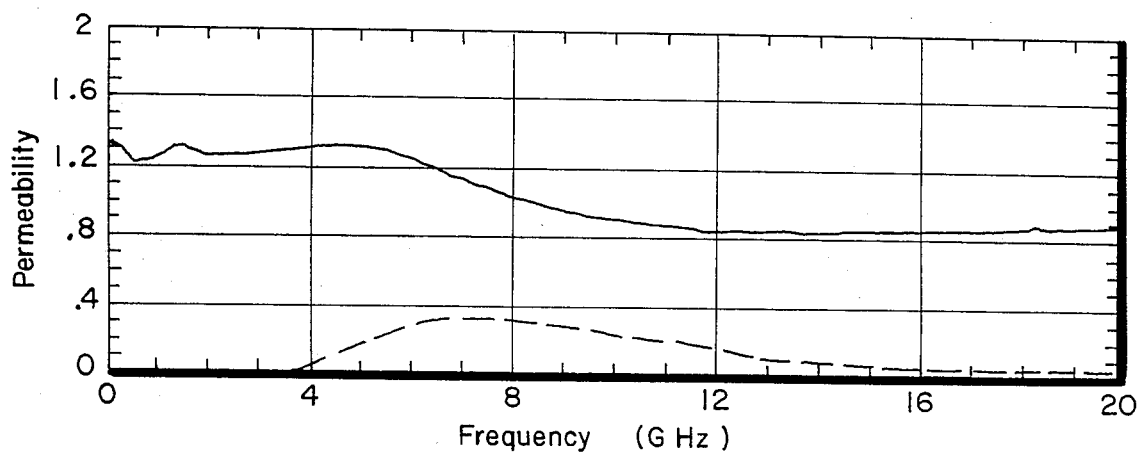
Figure 6B:
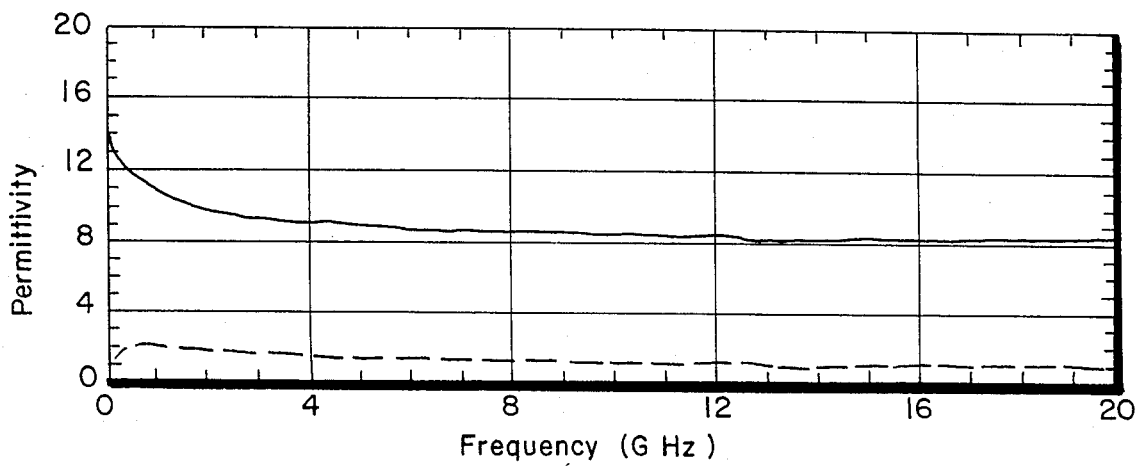
Figure 6B:
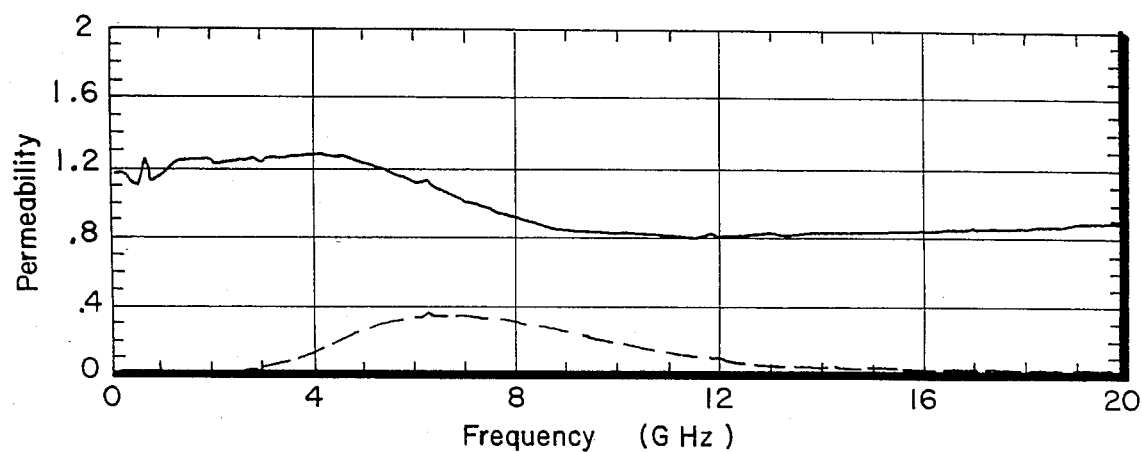

Further details of these particles are given in the table following, and in the graphs of the permittivity and permeability versus frequency for each by itself in the above-described host material at a 20% volume fraction as shown in FIGS. 6A and 6B:

TABLE II

| Parameter | Particles in Particulate A | Particles in Particulate B |
|---|---|---|
| Hc, Coercivity (Oe) | 633 | 655 |
| m, Moment (emu/gram) | 76 | 74 |
| Size, (microns) | 0.4 | 0.4 |
| Shape | acicular | acicular |
| Aspect ratio | 6:1/8:1 | 6:1 |

Particulate A is a stablized magnetic oxide of the composition described above.
Particulate B is available from Pfizer, Inc. under the product designation Pferrico 2670.

As can be seen in FIG. 6A, the imaginary part of the permeability of particulate A in the binding material at the frequency of interest, around 10.0 GHz, is significant and exceeds ten percent of the value taken by its corresponding real part. This is also true for particulate B in the binding material as indicated in the graphs of FIG. 6B. Note that while these magnetic properties of the particles in the two kinds of particulates are relatively similar, there are significant differences in the permittivity. Particulate A in the binding material exhibits a permittivity with a high real part over the frequency range presented and a low imaginary part. Particulate B in the binding material shows a lower real permittivity and, again, a low imaginary part. In other situations, the imaginary part of the permittivity might, alternatively or in addition, have a more significant imaginary part of frequencies of interest such as more than ten percent of the real part.

These two kinds of particles, A and B, were distributed together uniformly in the above described binding or host material to provide narrowband suppression of reflections of incident electromagnetic radiation around a frequency of 10.0 GHz from that incident radiation containing this frequency being reflected by a selected system. This system comprised an electrically conductive structure (a metallic rod having a diameter of 10.0 mm) screened by this composite material in the form of a tube, having an initial interior diameter of 15 mm and a wall thickness of 1.5 mm, by its conforming to the rod through being heat shrunk thereagainst. Each of these particulates was chosen to have a volume fraction of 10% of the composite material (with the binding or host material having a volume fraction of 80%), and the proper thickness of the material to provide this suppression of impinging radiation containing a frequency of 10.0 GHz was determined to be 2.46 mm.

An analysis of the kind leading to the last two equations above can be used to predict the necessary characteristics of the resulting composite material, an analysis, however, which is one extended to the situation of having two particulate kinds in the binding or host material rather than just one as these two equations represent. These last two equations above, on the other hand, are just the ones needed to extract the permittivity and permeability values over frequency of each particulate itself if each is measured in situ in the binding material from the resulting one particulate composite material permittivity and permeability found by measurements shown in FIGS. 6A and 6B. These particulate permittivities and permeabilities for particulates A and B can then be used as data for predicting the two particulate composite material resultant permittivity and permeability.

Figure 6C:
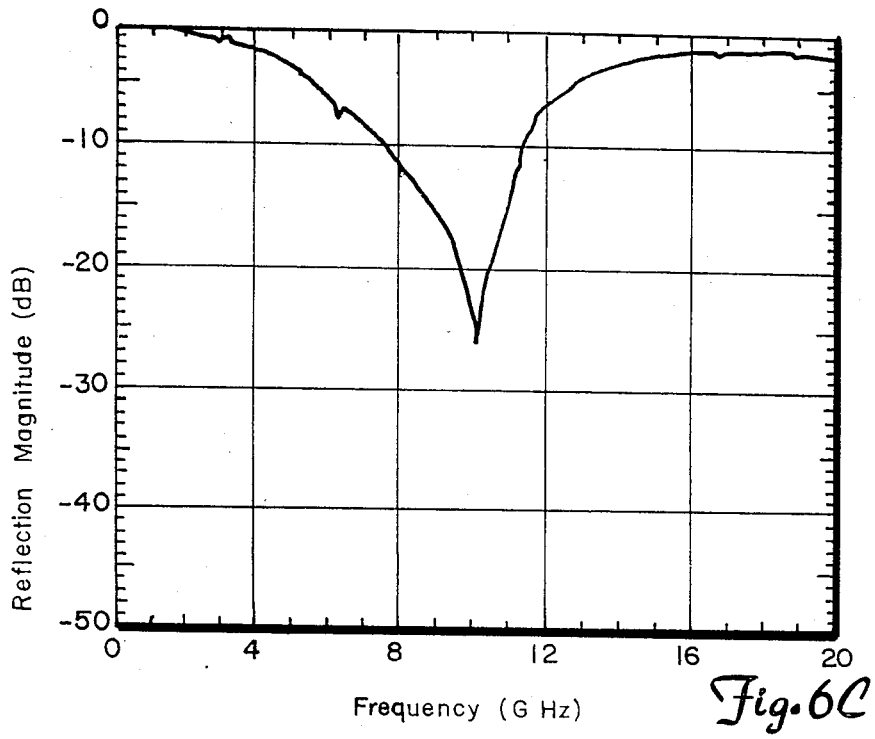

The two composite materials resulting from separately distributing each of particulates A and B in the above-described binding material each have a single-particulate composite material resultant permittivity and permeability which are, of course, just what is measured in situ and presented in FIGS. 6A and 6B. These parameters for each of these composite materials can be used to predict the suppression capabilities of each of them. The result for the composite material having particulate B therein in a 20% volume fraction screening the same kind of conductor (rod) as the two-particulate suppression covering indicated above is given in FIG. 6C where it is indicated that the single particulate suppression covering will provide a reflection attenuation between 20 and 30 db at about 10.0 GHz if it is 2.83 mm thick.

An alternative approach to the two-particulate composite material parameter prediction is also possible, based on one particulate composite material permeability and permability measurement shown in FIGS. 6A and 6B, which avoids extracting the individual particulate permittivities and permeabilities from this data. Though the constituent particulate and binding material permittivities and permeabilities usually combine in complex ways to provide the resultant composite material permittivity and permeability, the one particulate composite material permittivity and permeability for each particulate often combine effectively in a simpler way to give the permittivity and permeability of the two particulate composite material using the same binding material and particulates. That is, the combining in this latter situation is often close to being on an additive basis with the frequency characteristics being positionable along the frequency axis by controlling just the static conductivity of the particles in the particulates used.

The two particle composite material is formed by first mixing the materials listed for the binding or host material and extruding the resulting mixture as a sheet which is then cut into small pellets. These pellets and the first and second particulates are mixed together in a mixer at 250° F. The result of this second mixture is extruded in the form of a tube which, for this example, was of a 10 mm outer diameter, and had a 2.4 mm wall thickness. The tube was then irradiated by an electron beam to 3 megarads to cause cross-linking of the polymers therein. Thereafter, this irradiated tube was heated and expanded through a radial stretching to have an interior diameter of 15 mm, as indicated, using air pressure. The tube was then cooled in this expanded state. At that point, the tube was then ready to serve as suppression covering 16b shown in FIG. 5A. Alternatively, this tube can thereafter be divided parallel to its elongated axis to form suppression covering 16c shown in FIG. 5B. In the form shown in FIG. 5A, the tube was heat shrunk to the selected metallic rod in the example described above. The heat shrinking of this composite material tube onto the metallic rod in this initial configuration led to suppression covering 16b having a final state wall thickness of 2.46 mm as desired, a wall thickness significantly thinner than the wall thickness of the one-particulate composite material indicated above in connection with FIG. 6C using particulate B.

Figure 7A:
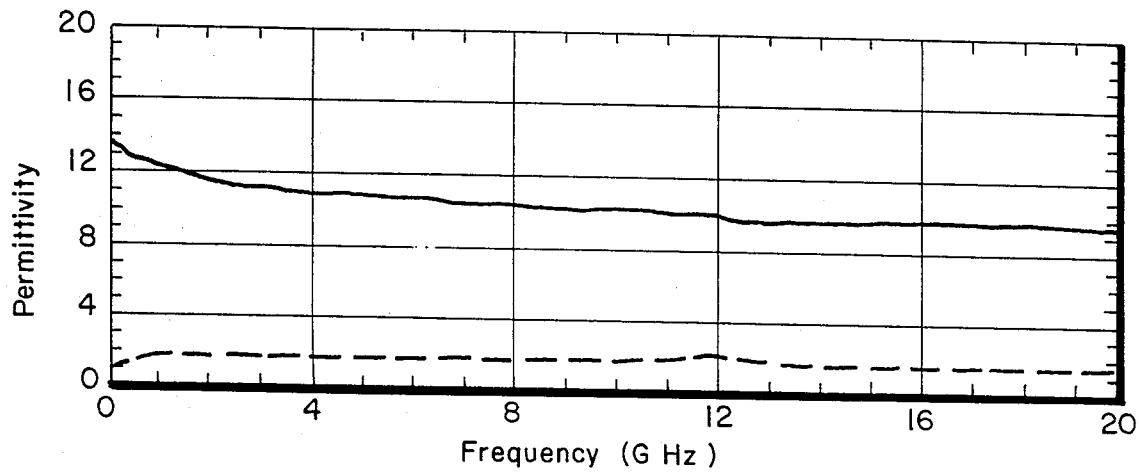
FIGS. 7A and 7B are graphs presenting properties of an embodiment of the present invention.
Figure 7A:
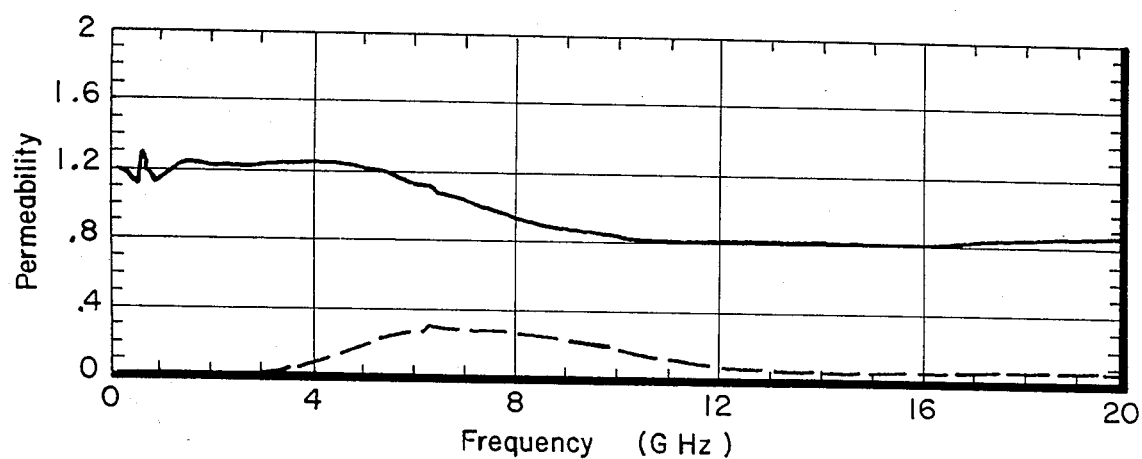

The composite material forming suppression covering 16b of FIG. 5A as a result of this process has the resultant values of permittivity and permeability shown in FIG. 7A, these coming about as a result of combining electrical and magnetic properties of the two kinds of particulates described, A and B, with the binding material described distributing them in that binding or host material to form this composite material. These properties shown in FIG. 7A can be predicted, as indicated above, from the properties shown in FIGS. 6A and 6B for the two kinds of particulates distributed in the composite material, and from the permittivity characteristics of the binding or host material using the appropriate methods indicated above.

As indicated above, two kinds of particulates were predicted and found to be needed to obtain a thinner wall in the composite material to achieve the narrow-band suppression of reflected electromagnetic radiation from the screened structure at a frequency of approximately 10.0 GHz. Attaining a wall thickness for a suppression covering which is relatively small compared to the one-particulate composite material led to needing a significant amount of absorption of the impinging electromagnetic radiation on the screened system. This requires that a significant amount of the impinging radiation be transmitted by the suppression covering wherein it can be absorbed to the necessary extent. The absorption will be about the same for both particulate A and particulate B since the imaginary part of the permeability of each is very similar, and because the imaginary part of the permittivity for each is so small that it is negligible. Thus, the absorption will not change by mixing these particulates together. Further, this absorption will occur at the frequency of interest since, as can be seen from FIGS. 6A and 6B, the ratio of the imaginary part of the permeability to the real part is relatively great at that point. These results are confirmed in FIG. 7A.

Particulate A, however, has too high a permittivity real part which would result in too much reflection at the outer surface of suppression covering 16 and so too little transmission in the covering. Particulate B, on the other hand, has too small a permittivity real part and would provide too much transmission. As can be seen in FIG. 7A, an intermediate value is achieved in the two particulate composite material used for suppression covering 16.

Figure 7B:
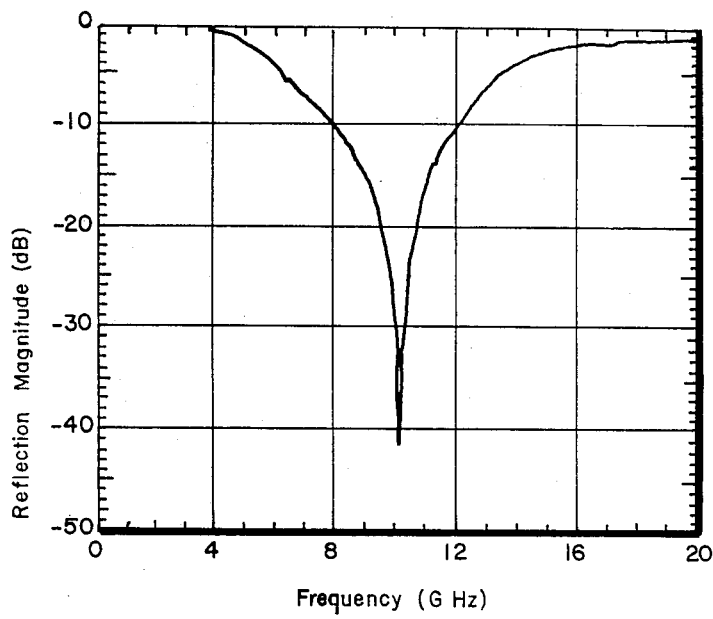

The result of using this two-particulate composite material to screen the selected metallic rod of 10.0 mm diameter is shown in FIG. 7B. The graph of FIG. 7B shows the reflection of electromagnetic radiation impinging on the rod screened with the composite material described above with respect to the reflection from that same rod in the absence of the composite material screening. As can be seen from that graph, the reflection at about 10.0 GHz is reduced or suppressed by more than 20 db, almost 30 db, due to the screening by the composite material. Depending on the situation, there may be desired either more of a reduction or attenuation in the reflection, or less, either of which can be accommodated by varying the choice of particulates and binding material.

Changing the volume fraction of either of these particulates, or varying the kinds or numbers of kinds of particulates, will lead to changes in the center frequency of maximum suppression and the bandwidth about that center frequency at which the suppression occurs, as well as requiring a corresponding different thickness of material to achieve the desired suppression. Thus, the volume fraction of the particulates might range from a low of 1% to the loading limit of the binding, or host, material before the ability of the binding material to shrink, for instance, was adversely affected. This might be somewhere between 45% to 70% by volume. Typically, a preferred range for the volume fraction is from 15% to 30%.

Again, by changing particle type, significantly different sizes in the particles may result, the range might be from a low of 0.001 μm to a high of several microns. Typically, the range preferred would be from 0.05 μm to 25 μm.

The choice of binding, or host, material will also have an effect on the electrical properties, but typically not nearly so great as the choice of particulates to be distributed therein. Thus, the choice of the binding material will also turn on other factors such as the temperature at which the shrinking process or the extruding process can be usefully accomplished, the ability of the material to withstand the environmental conditions in which it will be used so that the suppression covering does not deteriorate or become degraded in its capability, or transmit moisture, etc.

To illustrate the differences that choice of particulate type and volume fraction thereof can make, a further example composite material is provided using a third type of particulate, C, carbonyl iron spheres, type SF, in the same binding material described above in a 30% volume fraction screening the same kind of conductor as before (rod). Particulate C is available from GAF under this description. This particulate has the characteristics described in the following table:

TABLE III

| Parameter | Particles in Particulate C |
|---|---|
| Hc, Coercivity (Oe) | 170 |
| m, Moment (emu/gram) | 210 |
| Size, (microns) | 1.3 |
| Shape | Spherical |
| Aspect ratio | 1 |

Figure 8B:
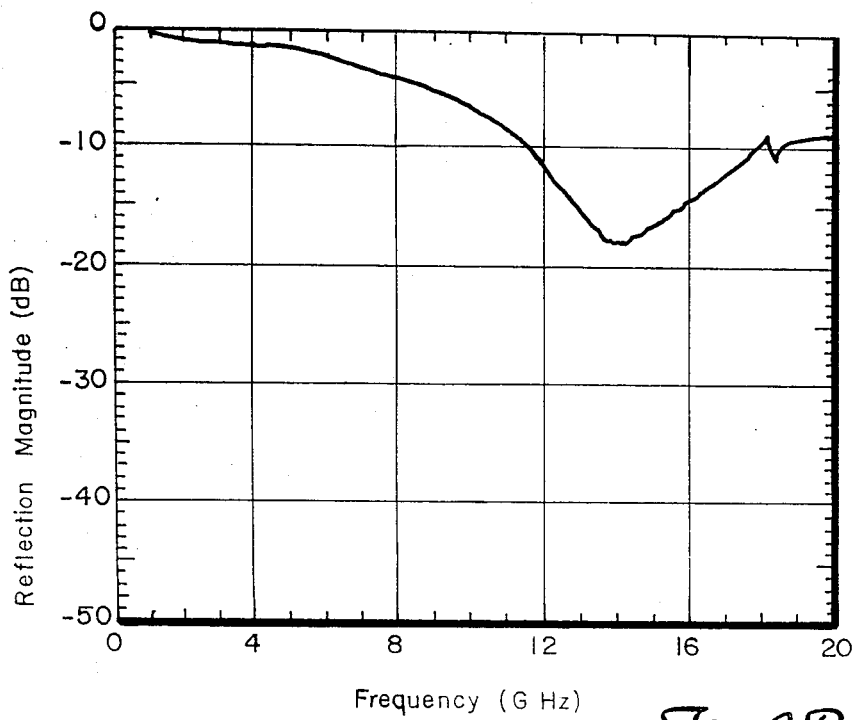
FIGS. 8A and 8B are graphs representing properties of an embodiment the present invention.
Figure 8A:
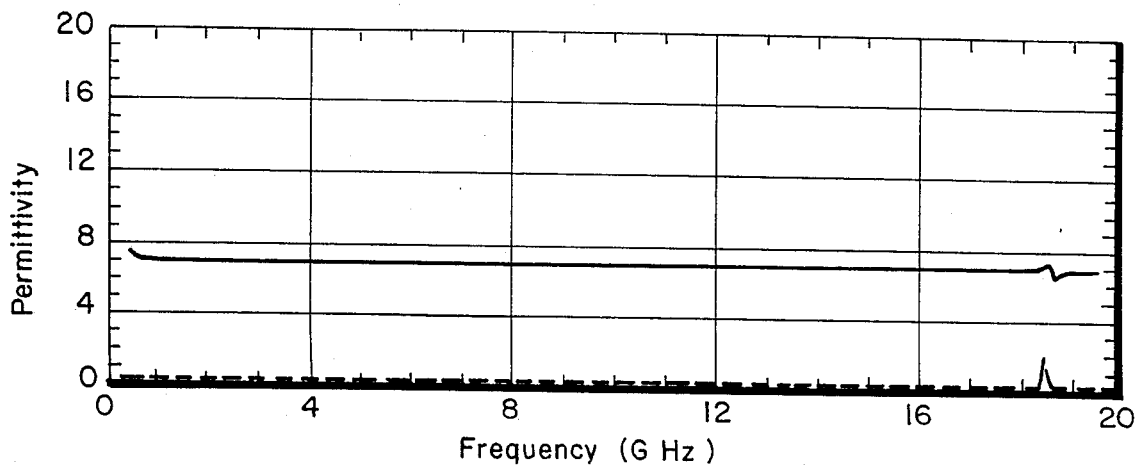
Figure 8A:
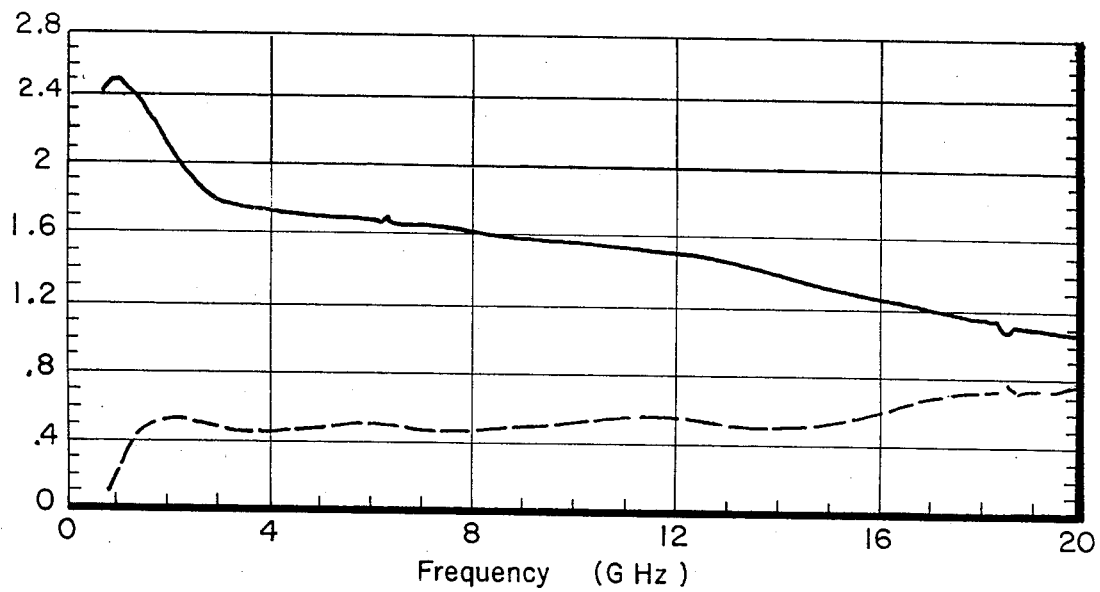

The resulting composite material has the permittivity and permeability characteristics shown in FIG. 8A. The reflection suppression or attentuation result is shown in FIG. 8B. As can be seen, the peak suppression has been shifted to around 14.0 GHz and its attenuation reduced to a little more than 15 db. The thickness of the suppression covering wall is 1.65 mm.

The ability to predict the performance of, and to choose from a wide variety of properties of, particulates is especially useful in connection with setting the bandwidth in which a suppression covering will act to suppress radiation impinging on a structure screened by such a composite material. In those instances where interference is used to suppress reflection of the impinging electromagnetic radiation, in addition to the use of absorption within a suppression covering, the frequency dependence of the permittivity and permeability of the composite material will have a direct influence on the bandwidth over which such suppression occurs. This frequency dependence of these parameters in the composite material, of course, must result from the frequency dependence of the permittivity and permeability properties of the binding or host matrix and the particulates distributed therein.

The effect of the frequency dependence of the permittivity and permeability of the composite material in situations where interference is used is suggested by the result reached above in a limiting case where interference is heavily relied upon. In that instance, the thickness of the suppression covering around a structure screened thereby was determined to be $$d = \frac{\lambda}{4} = \frac{\lambda_o}{4(\mu\epsilon)^{\frac{1}{2}}}$$

where the wavelength of the radiation in the suppression covering has been substituted for by the wavelength of this radiation as it comes from the source, that is, the radiation impinging on the covering times the factor indicating the effect on this source wavelength because of the source radiation entering in the material where it has a different wavelength due to the material permittivity and permeability properties.

As is well known from electromagnetic theory, the wavelength in a vacuum or near vacuum is equal to the speed of travel of the wave in that medium c divided by its angular frequency or by $2\pi$ times the event frequency or $$\lambda_o = \frac{c}{\omega} = \frac{c}{2\pi\nu}.$$

Substituting this last equation into the preceding equation provides the result $$d = \frac{c}{8\pi\nu(\mu\epsilon)^{\frac{1}{2}}}.$$

which can be rewritten as follows:

$$\nu = \frac{c}{8\pi d(\mu\epsilon)^{\frac{1}{2}}}.$$

This expression shows which of the frequencies in the impinging radiation will be subject to interference for a given thickness of the suppression covering having a permittivity and a permeability $\mu$.

Figure 9A:
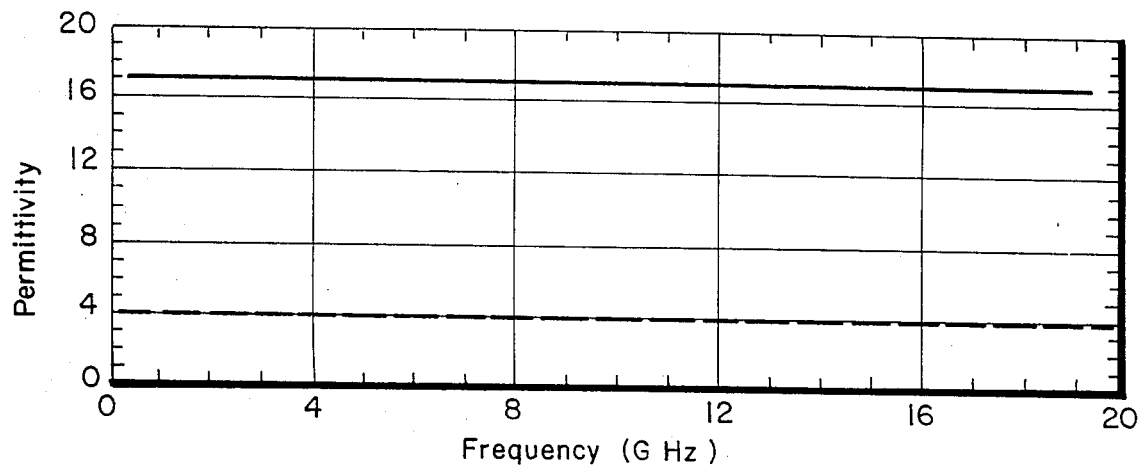
FIGS. 9A, 9B and 9C are representational graphs presenting properties of an illustration of an embodiment and of constituents of an embodiment of the present invention.
Figure 9A:
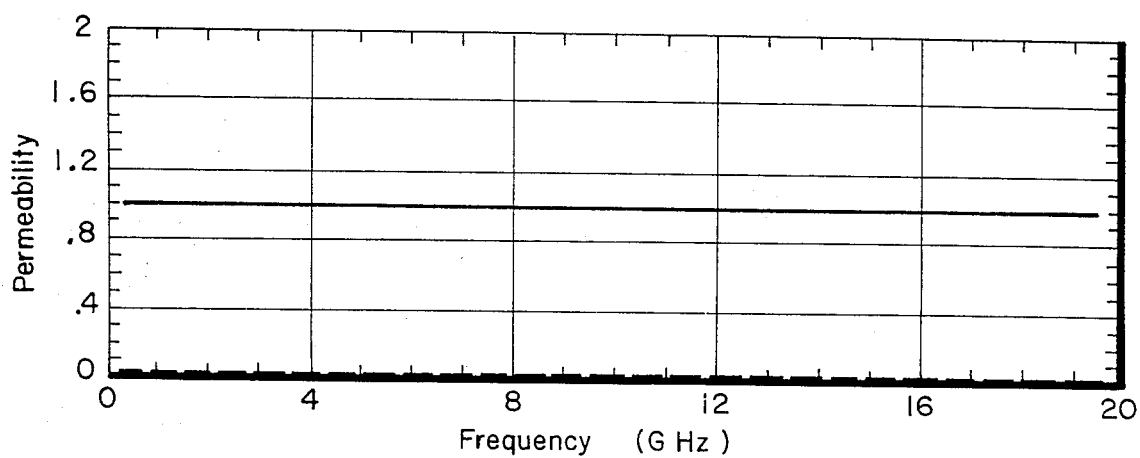

As can be seen, since the speed c is a constant in the vacuum and the thickness, d, of suppression covering is fixed once in place, should the permittivity and the permeability be constant, there will also be a constant value for $\nu$ representing the only frequency at which full interference occurs thereby yielding a narrowband reflection suppression system. FIG. 9A shows graphs with the values of the real and imaginary parts of the permittivity and permeability being constants with respect to frequency as an illustrative example.

The last equation shows, however, that if the factor $(\mu\epsilon)^{\frac{1}{2}}$ varies with frequency, the frequency of impinging radiation which will be subjected to interference can also change. Thus, if $\epsilon$ or $\mu$, or both, are functions of frequency there is a possibility of increasing the bandwidth over which reflection suppression occurs. As an example, a graph of permeability having a frequency dependency is shown in FIG. 9B.

Figure 9B:
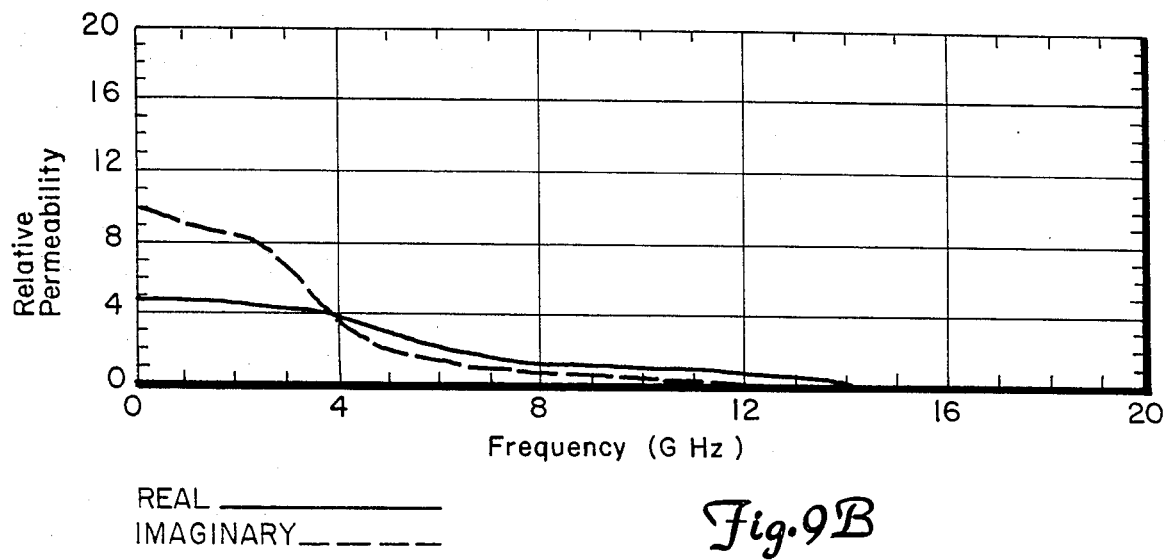
Figure 9C:
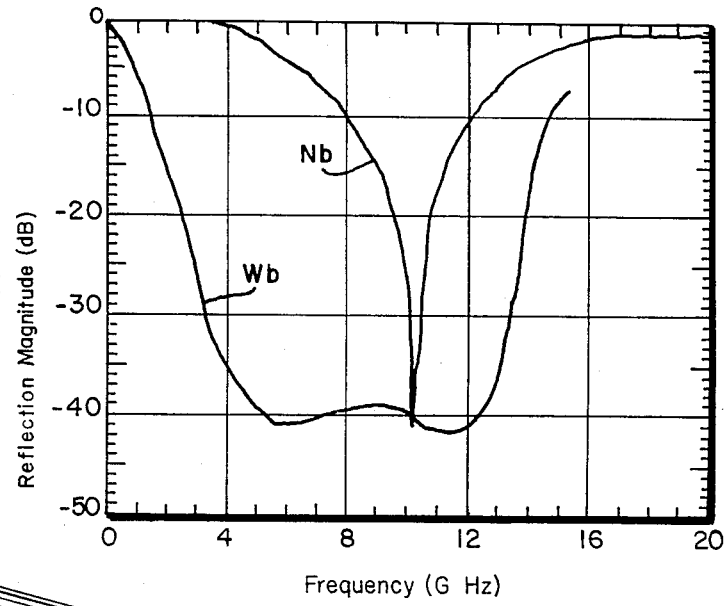

The results of using alternative composite materials in a suppression covering, one with the properties of FIG. 9A and one with the properties of FIG. 9B, are shown in the power graphs resulting for each alternate as presented in FIG. 9C. Curve Nb represents the narrowband result occurring because the suppression covering permittivity and permeability properties are constant with frequency as shown in FIG. 9A. Curve Wb shows the wideband suppression result if the permittivity continues to be a constant with frequency as shown in FIG. 9A but the permeability varies with frequency as shown in FIG. 9B.

As can clearly be seen, the suppression of reflected radiation occurs over a much wider range of frequencies for the curve Wb than for the curve Nb. In effect, the variation in composite material permittivity and permeability is selected to keep a quarter of the wavelengths of the radiation in the composite material, corresponding to the range of frequencies of interest in the impinging radiation, approximately equal to the thickness of the composite material serving as a suppression covering.

If the equation before the last equation is considered, one can see that to hold the right-hand side of the equation constant to match a constant d on the left-hand side of the equation, the factor $(\mu\epsilon)^{\frac{1}{2}}$ must decrease with increases in the frequency $v$. Thus, the value of the permittivity or the permeability or both must decrease with frequency if this condition is to be met, the frequency value of this decrease settling the low frequency end of the suppression frequency band. Clearly, at some point, there will be no further decreases occurring in these parameters available and increasing will lead to the interference condition no longer being met so that there will no longer be suppression of reflections of radiation containing frequencies above this point.

Figure 10:
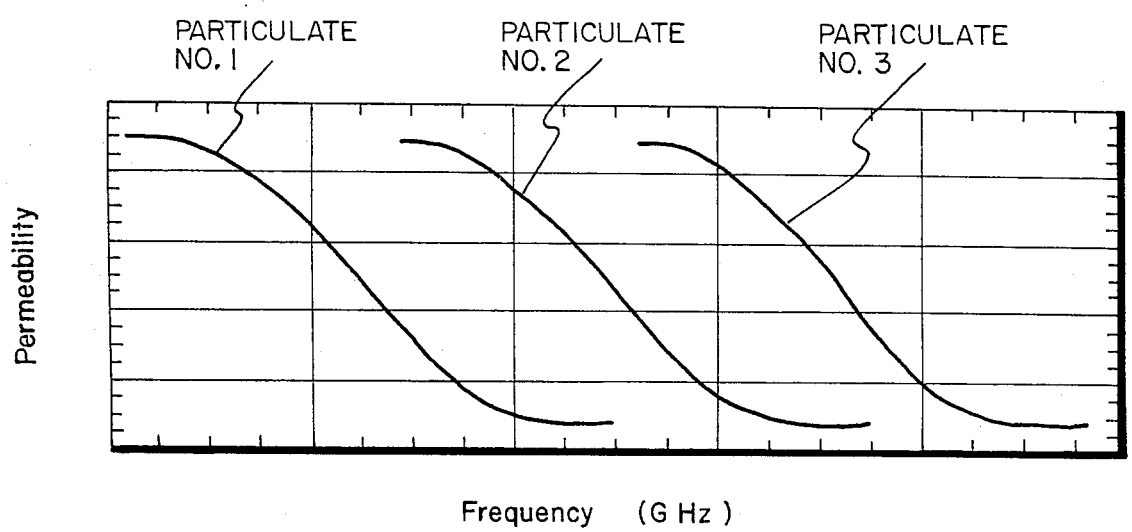
FIG. 10 is a representational graph of an illustration of an embodiment of the present invention.

However, the ability to put in more than one kind of particulate in the binding or host material allows substantial freedom in adjusting this bandwidth and the point at which the suppression begins along the frequency axis and at which the suppression ends. Thus, a series of kinds of particulates can be provided in a composite material, each of which has the permittivity or permeability thereof both with a magnitude that decreases with frequency over a range of frequencies differing from the others with successive such ranges overlapping the preceding one. There will result a substantial frequency range in which reflections are suppressed of impinging radiation on a screened structure screened by such a composite material containing this series of particulates. Such a series of particulates is illustrated schematically in FIG. 10 where the frequency characteristics of either the real or imaginary part of the permeability for three different particulates are shown which exhibit decreases in permeability occurring over different frequency ranges but all of which are in the frequency range of interest for suppression of reflected radiation.

Figure 11:
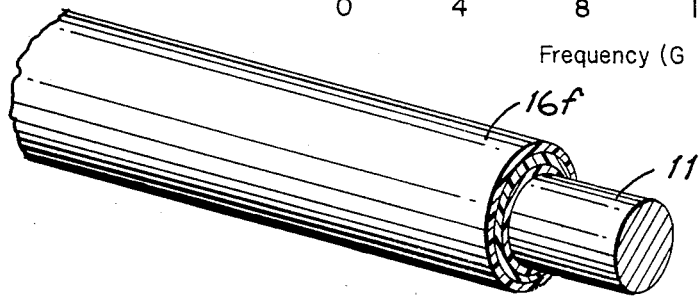
FIG. 11 shows a further embodiment of the present invention.

This scheme of using multiple particulates has its limits since continuing to add particulate types to a binding, or host, material to form a composite will lead to such a large volume fraction for the particulates that the ability of the binding material to conform to a selected structure may be impaired. An alternative is shown in FIG. 11 which is a laminate structure for an end portion of a suppression covering, 16f, in which the several lamina shown about an end portion of conductor 11 are each of a binding or host material and each contain one or more particulates. If the magnitude decrease with frequency range of interest for the particulates in each lamina are spread out across the suppression frequency range of interest in the fashion shown in FIG. 11, the result will be that reflections can be suppressed in different parts of this frequency range of interest by a corresponding lamina. In addition, further interfaces between lamina occur in this laminate structure, leading to further reflections and the possibility of greater design freedom for providing an interference arrangement for several cancellations of reflected waves to thereby give a negligible reflection coefficient from the screened structure system of FIG. 11 as a whole across the frequency range of interest.

A possible arrangement of the structure of FIG. 11 would be to provide a series of particulate distributions along a radius of the screened structure with different parameters in each such that the permittivity or permeability or both is increasing in each layer moving inward along that radius. These changing parameters in each layer are in effect changing the index of refraction along a radius from the center of the rod. Increasing the number of lamina in this arrangement in effect provides a result approaching that of a single suppression covering lamina having a graded index of refraction along a radius.

Thus, particle parameters in such a single lamina can be changed along a radius to provide the result given by laminar suppression covering 16f in FIG. 11. Particularly beneficial would be to have the initial permittivity and permeability parameters at the outer surface of the suppression covering be near those of a vacuum or air so as to minimize the reflection from this outer surface of the suppression covering.

Thus, there are a number of alternative possibilities for increasing the bandwidth of a suppression covering over which the reflections are suppressed of radiation impinging on a selected structure screened by such a suppression covering. Although the present invention has been described with reference to preferred embodiments, workers skilled in the art will recognize that changes may be made in form and detail without departing from the spirit and scope of the invention.

What is claimed is:

1. An electromagnetic radiation suppression covering for screening selected structures to thereby suppress to a selected extent, with respect to selected regions, presence of electromagnetic radiation of selected frequencies which has impinged on such screened structures, with screening of a corresponding selected structure to be accomplished through having a corresponding said suppression covering selectively conformed thereto, said suppression covering comprising a material means having at least a sheet portion of selected configuration formed of a polymeric binding material which is conformable to a corresponding selected structure through an initiation of a reduction in extent of a surface of said sheet portion in at least one direction due to forces internal thereto after said suppression covering has been position about such a corresponding selected structure, said sheet portion having distributed therein at least a first kind of particulate to thereby have permittivity and permeability parameters at least one of which has an imaginary part thereof with a magnitude that is at least one-tenth that of its corresponding real part for frequencies equal to at least some of said selected frequencies, said suppression covering having said first kind of particulate distributed in said sheet portion to thereby have an electromagnetic radiation reflection coefficient having a value at frequencies equal to said selected frequencies, for electromagnetic radiation containing at least some of said selected frequencies which is directly incident on said sheet portion at locations where it is conformed to a corresponding selected structure, of less than seven-tenths of that value of said reflection coefficient occurring at that location on at such a corresponding selected structure absent said suppression covering.

2. The article of claim 1 wherein said suppression covering has two edges which can be joined such that a cross section of said suppression covering with said edges joined follows a closed curve.

3. The article of claim 1 wherein said suppression covering consists entirely of said sheet portion and has a cross section which follows a closed curve.

4. The article of claim 3 wherein said sheet portion is seamless along said closed curve.

5. The article of claim 1 wherein said binding material with said particulate distributed therein in said sheet portion is heat shrinkable and said selective initiation is provision of heat thereto.

6. The apparatus of claim 5 wherein said polymeric binding material is formed from a group consisting of silicone polymers and polyolefin polymers and copolymers thereof.

7. The article of claim 1 wherein said binding material with said first kind of particulate distributed therein in said sheet portion is solvent shrinkable and said selective initiation is evaporation of a solvent therefrom.

8. The article of claim 7 wherein said polymeric binding material is an elastomer selected from a group consisting of polychloroprenes and natural rubbers and mixtures thereof.

9. The article of claim 1 wherein said binding material with said first of kind particulate distributed therein in said sheet portion is elastomeric and said selective initiation is a stretch thereof followed by said positioning of said suppression covering about a corresponding said selected structure and a subsequent release.

10. The article of claim 6 wherein said polymeric binding material is an elastomer selected from a group consisting of synthetic elastomers and natural rubbers.

11. The apparatus of claim 1 wherein said sheet portion has both its permittivity and permeability parameters with an imaginary part thereof of a magnitude that is at least one-tenth that of its corresponding real part for frequencies equal to at least some of said selected frequencies.

12. The article of claim 1 wherein said suppression covering is a laminate with at least a first one of said lamina therein being formed of said polymeric binding material having said sheet portion therein in which said first kind of particulate is distributed as aforesaid.

13. The article of claim 12 wherein there is a second lamina having a sheet portion adjacent said first lamina sheet portion formed of a polymeric binding material in which a second kind of particulate is distributed.

14. The article of claim 12 wherein there is a second lamina formed of an electrically conductive material and located adjacent to said first lamina.

15. The article of claim 13 wherein said second lamina sheet portion with said second kind of particulate distributed therein thereby has permittivity and permeability parameters at least one of which has an imaginary part thereof with a magnitude that is at least one-tenth that of its corresponding real part for frequencies equal to at least some of said selected frequencies.

16. The article of claim 15 wherein each of said first and second kinds of particulate comprises particles having a permittivity or a permeability parameter with an imaginary part thereof that significantly decreases over at least some frequencies equal to said selected frequencies with at least some frequencies over which that permittivity or permeability parameter of particles in said first kind of particulate decreases significantly differing from those frequencies over which that permittivity or permeability parameter of said second kind of particulate decreases significantly.

17. The article of claim 1 wherein said first kind of particulate leads to said sheet portion having said permittivity and permeability parameters through said particles therein being electrically conductive with a selected electrical conductivity.

18. The article of claim 17 wherein said particles in said first kind of particulate are formed of a composite having an electrically insulating interior with an electrically conducting coating thereon.

19. The article of claim 1 wherein said first kind of particulate leads to said sheet portion having said permittivity and permeability parameters through said particles therein being ferromagnetic with a selected magnetic permeability.

20. The article of claim 1 wherein at least a second kind of particulate is also distributed in said polymeric binding material in said sheet portion, and wherein each of said first and second kinds of particulate comprise particles having a permittivity parameter with an imaginary part thereof that significantly decreases over at least some frequencies equal to said selected frequencies with at least some frequencies over which that permittivity parameter of particles in said first kind of particulate decreases significantly differing from those frequencies over which that permittivity parameter of particles in said second kind of particulate decreases significantly.

21. The article of claim 1 wherein at least a second kind of particulate is also distributed in said polymeric binding material in said sheet portion, and wherein each of said first and second kinds of particulate comprise particles having a permeability parameter with an imaginary part thereof that significantly decreases over at least some frequencies equal to said selected frequencies with at least some frequencies over which that permeability parameter of particles in said first kind of particulate decreases significantly differing from those frequencies over which that permeability parameter of particles in said second kind of particulate decreases significantly.

22. The article of claim 1 wherein at least a second kind of particulate is also distributed in said polymeric binding material in said sheet portion, and wherein a selected one of said first and second kinds of particulate comprises particles having a permittivity parameter with an imaginary part thereof that significantly decreases over at least some frequencies equal to said selected frequencies and that kind of particulate remaining comprises particles having a permeability parameter with an imaginary part thereof that significantly decreases over at least some frequencies differing from those over which said permittivity parameter of particles in said first kind particulate decreases as aforesaid.

23. The article of claim 1 wherein said particles in said first kind of particulate have an average maximum cross section dimension which is less than one-tenth of those wavelengths of any electromagnetic radiation propagation in said sheet portion as a result of its impinging thereon containing frequencies which are among said selected frequencies.

24. The article of claim 11 wherein said particles in said first kind of particulate have an average maximum cross section dimension which is at least three times its average minimum cross section dimension.

25. The article of claim 1 wherein said first kind of particulate has a kind or particles selected from a group of two kinds of particles consisting of ferrosoferric oxide with a thin adsorbed surface layer of cobalt, and a ferric oxide with a thin adsorbed surface layer of cobalt and doubly ionized iron atoms.

26. An electromagnetic radiation suppression covering for screening selected structures to thereby suppress to a selected extent, with respect to selected regions, presence of electromagnetic radiation of selected frequencies which has impinged on such screened structures, with screening of a corresponding selected structure to be accomplished through having a corresponding said suppression covering selectively conformed thereto, said suppression covering comprising a material means having at least a sheet portion of a selected configuration formed of a polymeric binding material which is conformable to a corresponding selected structure through an initiation of a reduction in extent of a surface of said sheet portion in at least one direction due to forces internal thereto after said suppression covering has been positioned about such a corresponding selected structure, said sheet portion having distributed therein at least a first kind of particulate to thereby have permittivity and permeability parameters at least one of which has an imaginary part thereof with a magnitude that is at least one-tenth that of its corresponding real part for frequencies equal to at least some of said selected frequencies, said suppression covering having said sheet portion of a configuration capable of substantially reaching a selected thickness, as a result of said suppression covering being conformed to a corresponding said selected structure as aforesaid, which thickness is substantially one-fortieth to one-fourth of those wavelengths of that portion of any electromagnetic radiation propagating in said sheet portion as a result of its impinging thereon with frequencies therein which are among said selected frequencies.

27. The article of claim 26 wherein said suppression covering has two edges which can be joined such that a cross section of said suppression covering with said edges joined follows a closed curve.

28. The article of claim 26 wherein said suppression covering consists entirely of said sheet portion and has a cross section which follows a closed curve.

29. The article of claim 28 wherein said sheet portion is seamless along said closed curve.

30. The article of claim 26 wherein said binding material with said particulate distributed therein in said sheet portion is heat shrinkable and said selective initiation is provision of heat thereto.

31. The article of claim 30 wherein said polymeric binding material is formed from a group consisting of silicone polymers and polyolefin polymers and copolymers thereof.

32. The article of claim 26 wherein said binding material with said first kind of particulate distributed therein in said sheet portion is solvent shrinkable and said selective initiation is evaporation of a solvent therefrom.

33. The article of claim 32 wherein said polymeric binding material is an elastomer selected from a group consisting of synthetic elastomers and natural rubbers and mixtures thereof.

34. The article of claim 26 wherein said binding material with said first kind of particulate distributed therein in said sheet portion is elastomeric and said selective initiation is a stretch thereof followed by said positioning of said suppression covering about a corresponding said selected structure and a subsequent release.

35. The article of claim 34 wherein said polymeric binding material is an elastomer selected from a group consisting of synthetic elastomers and natural rubbers.

36. The article of claim 26 wherein said sheet portion has both its permittivity and permeability parameters with an imaginary part thereof of a magnitude that is at least one-tenth that of its corresponding real part for frequencies equal to at least some of said selected frequencies.

37. The article of claim 26 wherein said suppression covering is a laminate with at least a first one of said lamina therein being formed of said polymeric binding material having said sheet portion therein in which said first kind of particulate is distributed as aforesaid.

38. The article of claim 37 wherein there is a second lamina having a sheet portion adjacent said first lamina sheet portion formed of a polymeric binding material in which a second kind of particulate is distributed.

39. The article of claim 37 wherein there is a second lamina formed of an electrically conductive material and located adjacent to said first lamina.

40. The article of claim 38 wherein said second lamina sheet portion with said second kind of particulate distributed therein thereby has permittivity and permeability parameters at least one of which has an imaginary part thereof with a magnitude that is at least one-tenth that of its corresponding real part for at least some of said selected frequencies.

41. The article of claim 40 wherein each of said first and second kinds of particulate comprises particles having a permittivity or a permeability decreases over at least some frequencies equal to said selected frequencies with at least some frequencies over which that permittivity or permeability parameter of articles in said first kind of particulate decreases significantly differing from those frequencies over which that permittivity or permeability parameter of said second kind of particulate decreases significantly.

42. The article of claim 26 wherein said first kind of particulate leads to said sheet portion having said permittivity and permeability parameters through said particles therein being electrically conductive with a selected electrical conductivity.

43. The article of claim 42 wherein said particles in said first kind of particulate are formed of a composite having an electrically insulating interior with an electrically conducting coating thereon.

44. The article of claim 26 wherein said first kind of particulate leads to said sheet portion having said permittivity and permeability parameters through said particles therein being ferromagnetic with a selected magnetic permeability.

45. The article of claim 26 wherein at least a second kind of particulate is also distributed in said polymeric binding material in said sheet portion, and wherein each of said first and second kinds of particulate comprise particles having a permittivity parameter with an imaginary part thereof that significantly decreases over at least some frequencies equal to said selected frequencies with at least some frequencies over which that permittivity parameter of particles in said first kind of particulate decreases significantly differing from those frequencies over which that permittivity parameter of particles in said second kind of particulate decreases significantly.

46. The article of claim 26 wherein at least a second kind of particulate is also distributed in said polymeric binding material in said sheet portion, and wherein each of said first and second kinds of particulate comprise particles having a permeability parameter with an imaginary part thereof that significantly decreases over at least some frequencies equal to said selected frequencies with at least some frequencies over which that permeability parameter of particles in said first kind of particulate decreases significantly differing from those frequencies over which that permeability parameter of particles in said second kind of particulate decreases significantly.

47. The article of claim 26 wherein at least a second kind of particulate is also distributed in said polymeric binding material in said sheet portion, and wherein a selected one of said first and second kinds of particulate comprises particles having a permittivity parameter with an imaginary part thereof that significantly decreases over at least some frequencies equal to said selected frequencies and that kind of particulate remaining comprises particles having a permeability parameter with an least some frequencies differing from those over which said permittivity parameter of particles in said first kind particulate decreases as aforesaid.

48. The article of claim 26 wherein said particles in said first kind of particulate have an average maximum cross section dimension which is less than one-tenth of those wavelengths of any electromagnetic radiation propagating in said sheet portion as a result of its impinging thereon containing frequencies which are among said selected frequencies.

49. The article of claim 36 wherein said particles in said first kind of particulate have an average maximum cross section dimension which is at least three times its average minimum cross section dimension.

50. The article of claim 26 wherein said first kind of particulate has a kind or particles selected from a group of two kinds of particles consisting of ferrosoferric oxide with a thin adsorbed surface layer of cobalt, and a ferric oxide with a thin adsorbed surface layer of cobalt and doubly ionized iron atoms.

51. An electromagnetic radiation suppression covering for screening selected structures to thereby suppress to a selected extent, with respect to selected regions, presence of electromagnetic radiation of selected frequencies less than infrared frequencies which has impinged on such screened structures, with screening of a corresponding selected structure to be accomplished through having a corresponding suppression covering selectively conformed thereto, said suppression covering comprising a material means having at least a sheet portion of a selected configuration formed of a polymeric binding material which is conformable to a corresponding selected structure through an initiation of a reduction in extent of a surface of said sheet portion in at least one direction due to forces internal thereto after said suppression covering has been positioned about such a corresponding selected structure, said sheet portion having distributed therein at least a first kind of particulate to thereby have permittivity and permeability parameters at least one of which has an imaginary part thereof with a magnitude that is at least one-tenth that of its corresponding real part for frequencies equal to at least some of said selected frequencies, whereby that part of any electromagnetic radiation containing said selected frequencies impinging on a selected structure, if screened by said suppression covering through its being conformed thereto as aforesaid, is suppressed in selected regions thereabout.

52. The article of claim 51 wherein said suppression covering has two edges which can be joined such that a cross section of said suppression covering with said edges joined follows a closed curve.

53. The article of claim 51 wherein said suppression covering consists entirely of said sheet portion and has a cross section which follows a closed curve.

54. The article of claim 51 wherein said binding material with said particulate distributed therein in said sheet portion is heat shrinkable and said selective initiation is provision of heat thereto.

55. The article of claim 51 wherein said binding material with said first kind of particulate distributed therein in said sheet portion is solvent shrinkable and said selective initiation is evaporation of a solvent therefrom.

56. The article of claim 51 wherein said binding material with said first kind of particulate distributed therein in said sheet portion is elastomeric and said selective initiation is a stretch thereof followed by said positioning of said suppression covering about a corresponding said selected structure and a subsequent release.

57. The article of claim 51 wherein said sheet portion has both its permittivity and permeability parameters with an imaginary part thereof of a magnitude that is at least one-tenth that of its corresponding real part for frequencies equal to at least some of said selected frequencies.

58. The article of claim 51 wherein at least a second kind of particulate is also distributed in said polymeric binding material in said sheet portion.

59. The article of claim 51 wherein said suppression covering is a laminate with at least a first one of said lamina therein being formed of said polymeric binding material having said sheet portion therein in which said first kind of particulate is distributed as aforesaid.

60. The article of claim 51 wherein said first kind of particulate leads to said sheet portion having said permittivity and permeability parameters through said particles therein being electrically conductive with a selected electrical conductivity.

61. The article of claim 51 wherein said first kind of particulate leads to said sheet portion having said permittivity and permeability parameters through said particles therein being ferromagnetic with a selected magnetic permeability.

62. The article of claim 51 wherein said first kind of particulate has a kind of particles selected from a group of two kinds of particles consisting of ferrosoferric oxide with a thin adsorbed surface layer of cobalt, and a ferric oxide with a thin adsorbed surface layer of cobalt and doubly ionized iron atoms.

63. A covered conductor about which, with respect to selected regions, presence of electromagnetic radiation of selected frequencies which has impinged on said covered conductor is suppressed to a selected extent, said covered conductor comprising:
a conductor of a selected electrical conductivity which is elongated; and
a covering material formed about said elongated conductor absent any seam extending substantially parallel to said axis thereof, and formed directly against said elongated conductor substantially absent of any other material being interposed therebetween, said covering material having distributed therein at least a first kind of particulate to thereby have permittivity and permeability parameters at least one of which has an imaginary part thereof with a magnitude that is at least one-tenth that of its corresponding real part of frequencies equal to at least some of said selected frequencies to result in said covering material having an electromagnetic radiation reflection coefficient with a value at frequencies equal to said selected frequencies for electromagnetic radiation containing at least some of said selected frequencies which is directly incident thereon, of less than seven-tenths of that value of said reflection coefficient at such a location on said conductor absent said covering material.

64. The article of claim 63 wherein said covering material with said first kind of particulate distributed therein is a polymeric material heat shrunk to conform to said elongated conductor.

65. The article of claim 64 wherein said covering material is formed from a group consisting of silicone polymers and polyolefin polymers and copolymers thereof.

66. The article of claim 63 wherein, said covering material with said first kind of particulate distributed therein is a polymeric material which has been extruded about said elongated conductor.

67. The article of claim 66 wherein said covering material is a polymeric material selected from a group consisting of polyvinyl chloride, polyethylene, polyamide and polyurethane.

68. The article of claim 63 wherein said covering material with said first kind of particulate distributed therein is a polymeric material solvent shrunk to said elongated conductor.

69. The article of claim 68 wherein said polymeric binding material is an elastomer selected from a group consisting of polychloroprenes and natural rubbers and mixtures thereof.

70. The article of claim 63 wherein said covering material with said first kind of particulate distributed therein is an elastomeric material which has elastic forces holding it about said elongated conductor.

71. The article of claim 70 wherein said polymeric binding material is an elastomer selected from a group consisting of synthetic elastomers and natural rubbers.

72. The article of claim 63 wherein said covering material has both its permittivity and permeability parameters with an imaginary part thereof of a magnitude that is at least one-tenth that of its corresponding real part for frequencies equal to at least some of said selected frequencies.

73. The article of claim 63 wherein at least a second kind of particulate is also distributed in said covering material.

74. The article of claim 63 wherein said first kind of particulate leads to said sheet portion having said permittivity and permeability parameters through said particles therein being electrically conductive with a selected conductivity.

75. The article of claim 74 wherein said particles in said first kind of particulate are formed of a composite having an electrical insulating interior with an electrical conducting coating thereon.

76. The article of claim 63 wherein said first kind of particulate leads to said sheet portion having said permittivity and permeability parameters through said particles therein being ferromagnetic with a selected magnetic permeability.

77. The article of claim 63 wherein said particles in said first kind of particulate have an average maximum cross section dimension which is less than one-tenth of those wavelengths of any electromagnetic radiation propagating in said covering material as a result of its impinging thereon containing frequencies which are among said selected frequencies.

78. The article of claim 63 wherein said particles in said first kind of particulate have an average maximum cross section dimension which is at least three times its average minimum cross section dimension.

79. The article of claim 63 wherein said first kind of particulate has a kind of particles selected from a group of two kinds of particles consisting of ferrosoferric oxide with a thin adsorbed surface layer of cobalt, and a ferric oxide with a thin adsorbed surface layer of cobalt and doubly ionized iron atoms.

80. A method for suppressing to a selected extent, with respect to selected regions about a selected structure, presence of electromagnetic radiation of selected frequencies which has impinged on an arrangement including that selected structure, said method comprising:

forming a suppression covering in a selected configuration adapted to cover at least a portion of a corresponding structure, said suppression covering formed of a polymeric binding material in at least a sheet portion thereof which is capable of having a reduction in an extent of surface thereof due to internal forces initiated in at least one direction therealong, said sheet portion having distributed therein a first kind of particulate to thereby have permittivity and permeability parameters at least one of which has an imaginary part thereof with a magnitude that is at least one-tenth that of its corresponding real part for frequencies equal to at least some of said selected frequencies; and conforming said suppression covering about at least a portion of a selected corresponding structure by initiating a reduction in said surface extent of said sheet portion such that said sheet portion after such conformation has a resulting thickness which is substantially one-fortieth to one-fourth of a wavelength of that portion of any electromagnetic radiation propagating in said sheet as a result of its impinging thereof with frequencies therein which are among said selected frequencies.

81. The method of claim 80 wherein said conforming of said suppression covering about at least a portion of said selected corresponding structure further comprises joining two edges of said suppression covering such that a cross section of said suppression covering with said edges joined follows a closed curved.

82. The method of claim 80 wherein said conforming of said suppression covering about at least a portion of said selected corresponding structure further comprises having said suppression covering in a tubular form which is placed about said selected corresponding structure, and said initiating of a reduction in said surface extent comprises shrinking said suppression covering about said selected corresponding structure.

83. The method of claim 80 wherein an electrical conductive material tubular means is positioned about said selected corresponding structure within said suppression covering and said suppression covering is shrunken therearound.

84. The method of claim 80 wherein said sheet portion has both its permittivity and permeability parameters with an imaginary part thereof of a magnitude that is at least one-tenth that of its corresponding real part for frequencies equal to at least some of said selected frequencies.

85. The method of claim 80 wherein said first kind of particulate has particles of a permittivity or permeability parameter having an imaginary part thereof that significantly decreases over at least some frequencies equal to said selected frequencies.

86. The method of claim 80 wherein at least a second kind of particulate is also distributed in said polymeric binding material in said sheet portion.

87. A method for providing a means capable of suppressing to a selected extent, with respect to selected regions about a selected structure, presence of electromagnetic radiation at selected frequencies which has impinged on an arrangement including that selected structure, said method comprising:

selecting a first kind of particulate having permittivity and permeability parameters at least one of which has an imaginary part thereof with a magnitude that is at least one-tenth that of its corresponding real part for frequencies equal to at least some of said selected frequencies;

selecting a resin which will yield a polymeric binding material of a selected permittivity at said selected frequencies which is capable of having said first kind of particulate distributed therein and which is capable of being selectively conformed with said first kind or particulate therein to a corresponding structure; and mixing together said first kind of particulate and said resin and extruding a seamless tube of this mixture to result in said tube having an electromagnetic radiation reflection coefficient with a value at frequencies equal to said selected frequencies, for electrode magnetic radiation containing at least some of said selected frequencies which is directly incident on said tube at locations where it is conformed to a corresponding selected structure, of less than seven tenths of that value of said reflection coefficient occurring at such a location on that corresponding selected structure absence said tube.

88. The method of claim 87 wherein said extruding of a tube further comprises extruding said tube about an elongated conductor.

89. The method of claim 87 wherein said tube has both its permittivity and permeability parameters with an imaginary part thereof of a magnitude that is at least one-tenth that of its corresponding real part for frequencies equal to at least some of said selected frequencies.

90. The method of claim 87 wherein said first kind of particulate has particles with a permittivity or permeability parameter having an imaginary part thereof that significantly decreases over at least some frequencies equal to said selected frequencies.

91. The method of 87 wherein said extruding of a tube further comprises preparing such tube that subsequently a surface extent thereof can be reduced in at least one direction so that said tube can be conformed to a selected corresponding said selected structure.

92. The method of claim 91 wherein said extruding of said tube further comprises irradiating said tube, heating said tube, stretching said tube and cooling said tube while stretched.

93. The method of claim 92 wherein said cooling is followed by dividing said tube along a tube wall substantially parallel to its elongation to form two tube edges, and affixing a joining means to said tube edges so that a tube is capable of being formed by joining.

* * * * *

UNITED STATES PATENT AND TRADEMARK OFFICE
CERTIFICATE OF CORRECTION

PATENT NO. : 4,814,546
DATED : March 21, 1989
INVENTOR(S) : Leland R. Whitney, Charles D. Hoyle, and Ronald W. Seemann It is certified that error appears in the above-identified patent and that said Letters Patent is hereby corrected as shown below:

Claim 1, Column 26, line 49, "position" should read -- positioned --

Claim 1, Column 26, line 65, "on at" should read -- on --.

Claim 9, Column 27, line 25, "of kind" should read -- kind of --.

Claim 11, Column 27, line 33, "apparatus" should read -- article --.

Claim 47, Column 31, line 17, after "an" and before "least" insert -- imaginary part thereof that significantly decreases over at --.

Claim 47, Column 31, line 19, "kind" should read -- kind of --.

Claim 63, Column 32, line 65, "of" should read -- for --.

Claim 66, Column 33, line 15, "wherein," should read -- wherein --.

Claim 80, Column 34, line 39, "thereof" should read -- thereon --.

Claim 81, Column 34, line 46, "curved" should read -- curve --.

Claim 87, Column 36, line 4, "absence" should read -- absent --.

Claim 91, Column 36, line 18, "87" should read -- Claim 87 --.

Claim 93, Column 36, line 31, "a" should read -- said --.

Signed and Sealed this

Nineteenth Day of June, 1990

*Attest:*

HARRY F. MANBECK, JR.

*Attesting Officer*  *Commissioner of Patents and Trademarks*